United States Patent
Nishimura et al.

(10) Patent No.: US 9,618,654 B2
(45) Date of Patent: Apr. 11, 2017

(54) FILM-FORMING COMPOSITION

(71) Applicant: NISSAN CHEMICAL INDUSTRIES, LTD., Tokyo (JP)

(72) Inventors: Naoya Nishimura, Funabashi (JP); Takahiro Kaseyama, Funabashi (JP); Yasufumi Shikauchi, Funabashi (JP); Natsumi Murakami, Sodegaura (JP); Masashi Abe, Sodegaura (JP); Shigeru Mitsui, Sodegaura (JP); Masaaki Ozawa, Funabashi (JP)

(73) Assignee: NISSAN CHEMICAL INDUSTRIES, LTD., Toyko (JP)

( * ) Notice: Subject to any disclaimer, the term of this patent is extended or adjusted under 35 U.S.C. 154(b) by 108 days.

(21) Appl. No.: 14/400,255

(22) PCT Filed: May 10, 2013

(86) PCT No.: PCT/JP2013/063148
§ 371 (c)(1),
(2) Date: Nov. 10, 2014

(87) PCT Pub. No.: WO2013/168788
PCT Pub. Date: Nov. 14, 2013

(65) Prior Publication Data
US 2015/0115247 A1    Apr. 30, 2015

(30) Foreign Application Priority Data

May 11, 2012 (JP) ................. 2012-109359
Jun. 29, 2012 (JP) ................. 2012-146913
Oct. 23, 2012 (JP) ................. 2012-233685
Feb. 6, 2013 (JP) ................. 2013-021034

(51) Int. Cl.
| | |
|---|---|
| C09D 179/04 | (2006.01) |
| C08G 73/02 | (2006.01) |
| C08G 73/06 | (2006.01) |
| H01L 31/0232 | (2014.01) |
| G02B 1/04 | (2006.01) |
| H01L 51/52 | (2006.01) |
| H01L 27/32 | (2006.01) |
| G02B 5/02 | (2006.01) |

(52) U.S. Cl.
CPC .......... *G02B 1/04* (2013.01); *C08G 73/026* (2013.01); *C08G 73/0273* (2013.01); *C08G 73/0644* (2013.01); *C09D 179/04* (2013.01); *G02B 5/0226* (2013.01); *H01L 27/3241* (2013.01); *H01L 51/5253* (2013.01); *H01L 51/5268* (2013.01); *H01L 51/5275* (2013.01); *C08J 2379/04* (2013.01); *G02B 5/0242* (2013.01)

(58) Field of Classification Search
CPC .. C09D 179/02; C09D 179/04; C08G 73/026; C08G 73/0273; C08G 73/0644; H01L 31/02327

USPC .................. 544/194; 528/423, 288; 523/200
See application file for complete search history.

(56) References Cited

U.S. PATENT DOCUMENTS

| | | | |
|---|---|---|---|
| 5,886,130 A | 3/1999 | Trimmer et al. | |
| 8,618,243 B2 | 12/2013 | Nishimura et al. | |
| 8,710,174 B2 | 4/2014 | Nishimura et al. | |
| 8,760,763 B2 | 6/2014 | Takeuchi | |
| 9,243,165 B2 * | 1/2016 | Kato | C08G 73/026 |
| 2012/0316266 A1 | 12/2012 | Koyama et al. | |
| 2013/0154043 A1 | 6/2013 | Kato et al. | |
| 2013/0281620 A1 | 10/2013 | Nishimura et al. | |

FOREIGN PATENT DOCUMENTS

| | | |
|---|---|---|
| JP | 2000-53659 A | 2/2000 |
| JP | 2007-246877 A | 9/2007 |
| JP | 2008-24832 A | 2/2008 |
| JP | 2008-185956 A | 8/2008 |
| JP | 2009-155440 A | 7/2009 |
| JP | 2010-195636 A | 9/2010 |
| WO | WO 2010/128661 A1 | 11/2010 |
| WO | WO 2011/090084 A1 | 7/2011 |
| WO | WO 2012/026451 A1 | 3/2012 |
| WO | WO 2012/060286 A1 | 5/2012 |

OTHER PUBLICATIONS

English translation of International Preliminary of Patentability and Written Opinion issued Nov. 20, 2014, in PCT International Application No. PCT/JP2013/063148.
International Search Report issued Jul. 16, 2013, in PCT International Application No. PCT/JP2013/063148.

* cited by examiner

*Primary Examiner* — Venkataraman Balasubramanian
(74) *Attorney, Agent, or Firm* — Birch, Stewart, Kolasch & Birch, LLP

(57) ABSTRACT

This film-forming composition includes, for example, a polymer, crosslinking agent and light-diffusing agent that contain a triazine ring-containing repeating unit structure such as that represented formula (17), and is able to provide cured films with good light diffusing properties. Furthermore, this film-forming composition, which includes the same polymer, crosslinking agent and fine inorganic particles having a cross-linkable functional group, is able to provide cured films with good high temperature and high humidity resistance.

(17)

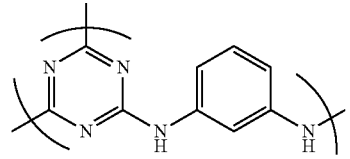

25 Claims, 3 Drawing Sheets

FILM-FORMING COMPOSITION

TECHNICAL FIELD

The present invention relates to a film-forming composition. More specifically, the invention relates to a film-forming composition suitable for forming a film having light scattering properties, and to a film-forming composition suitable for forming a film having resistance to high temperatures and high humidity.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compounds. Of such compounds, episulfide polymeric compounds and thiourethane polymeric compounds, both of which have sulfur atoms introduced thereon, are in practical use today as high-refractive index lenses for eyeglasses.

The most effective way to achieve even higher refractive indices in polymeric compounds is known to involve the use of inorganic metal oxides.

For example, a method for increasing the refractive index by using a hybrid material composed of a siloxane polymer mixed with a material containing small dispersed particles of zirconia, titania or the like has been disclosed (Patent Document 1).

A method in which a condensed ring skeleton having a high refractive index is introduced onto portions of a siloxane polymer has also been disclosed (Patent Document 2).

However, in materials that use inorganic metal oxides, there is a trade-off between refractive index and transparency, which makes it difficult to increase the transparency while retaining a high refractive index.

Accordingly, as a way to maintain transparency, investigations have been conducted on dispersing, within a film-forming composition, fine particles of an inorganic oxide having an average primary particle size no larger than the wavelength of visible light. A higher refractive index and a greater transparency have been achieved using this approach (Patent Document 3). The method used for dispersing fine particles of inorganic oxide is generally a technique that involves mixing together a polymer solution and a dispersion of inorganic fine particles, with the polymer playing the role of a binder which stabilizes, without destroying, the dispersion of inorganic fine particles.

In addition, numerous attempts have been made to impart heat resistance to polymeric compounds. Specifically, it is well known that the heat resistance of polymeric compounds can be improved by introducing aromatic rings. For example, polyarylene copolymers with substituted arylene recurring units on the backbone have been disclosed (Patent Document 4). Such polymeric compounds show promise primarily in use as heat-resistant plastics.

Melamine resins are familiar as triazine resins, but have very low decomposition temperatures compared with heat-resistant materials such as graphite.

The heat-resistant organic materials composed of carbon and nitrogen that have been in use up until now are for the most part aromatic polyimides and aromatic polyamides. However, because these materials have linear structures, their heat-resistance temperatures are not all that high.

Triazine-based condensation materials have also been reported as nitrogen-containing polymeric materials having heat resistance (Patent Document 6).

In recent years, there has arisen a need for high-performance polymeric materials in the development of electronic devices such as liquid-crystal displays, organic electroluminescence (EL) displays, optical semiconductor devices (LEDs), solid-state image sensors, organic thin-film solar cells, dye-sensitized solar cells and organic thin-film transistors.

The specific properties desired in such polymeric materials include (1) heat resistance, (2) transparency, (3) high refractive index, (4) high solubility, (5) low volume shrinkage, and (6) resistance to high temperatures and high humidity.

The inventors earlier discovered that hyperbranched polymers containing recurring units with a triazine ring and an aromatic ring have a high refractive index, are capable of achieving, with the polymer alone, high heat resistance, high transparency, high refractive index, high solubility and low volume shrinkage, and are thus suitable as film-forming compositions in the manufacture of electronic devices (Patent Document 6). However, when employing cured films produced from such compositions as light-extracting layers in organic EL devices or light-emitting diodes, a higher light-extracting efficiency (light-diffusing efficiency) is desired.

Although cured films produced from such compositions, when employed in electronic devices, are required to have durability under harsh conditions of high temperature and high humidity, this point has not hitherto been investigated.

It has been reported that films obtained from film-forming compositions prepared by dispersing inorganic fine particles in a binder resin composition having a refractive index of about 1.5 exhibit a resistance to high temperatures and high humidity (Patent Documents 7 and 8).

The inventors have already reported compositions obtained by the addition of inorganic fine particles to a triazine ring-containing hyperbranched polymer (Patent Document 9), although there are no reported examples of compositions that form films which exhibit resistance to high temperatures and high humidity or of light-scattering film-forming compositions.

PRIOR ART DOCUMENTS

Patent Documents

Patent Document 1: JP-A 2007-246877
Patent Document 2: JP-A 2008-24832
Patent Document 3: JP-A 2008-185956
Patent Document 4: U.S. Pat. No. 5,886,130
Patent Document 5: JP-A 2000-53659
Patent Document 6: WO 2010/128661
Patent Document 7: JP-A 2009-155440
Patent Document 8: JP-A 2010-19563.6
Patent Document 9: WO 2012/026451

SUMMARY OF THE INVENTION

Problems to be Solved by the Invention

It is therefore an object of the present invention to provide a film-forming composition which includes a triazine ring-containing polymer that is capable of achieving, with the polymer alone, high heat resistance, high transparency, high refractive index, high solubility and low volume shrinkage, and which is capable of providing cured films having a good light-diffusing efficiency and a good light-extracting efficiency. A further object of the invention is to provide a film-forming composition which is capable of enduring a harsh environment of high temperatures and high humidity and is suitable for the production of films for electronic devices.

Means for Solving the Problems

As a result of extensive investigations, the inventors have discovered that a film-forming composition which includes a specific triazine ring-containing polymer, a crosslinking agent and a light-diffusing agent is capable of providing cured films of good light-diffusing efficiency and light-extracting efficiency. The inventors have also discovered that a film-forming composition which includes a specific triazine ring-containing polymer, a crosslinking agent and inorganic fine particles having crosslinkable functional groups is capable of providing films that are resistant to high temperatures and high humidity and are suitable as films for electronic devices.

Accordingly, the invention provides the following film-forming compositions.

1. A film-forming composition characterized by including a triazine ring-containing polymer which includes a recurring unit structure of formula (1) below

[Chemical Formula 1]

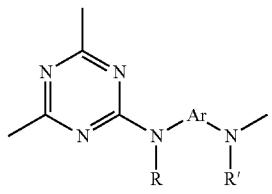
(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

[Chemical Formula 2]

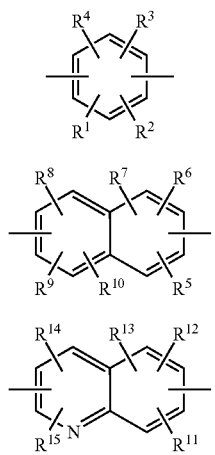

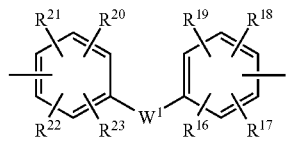
(5)

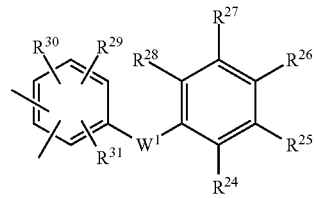
(6)

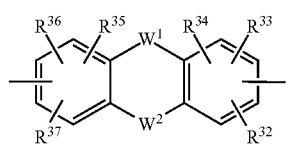
(7)

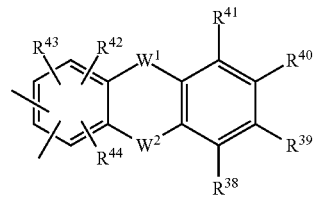
(8)

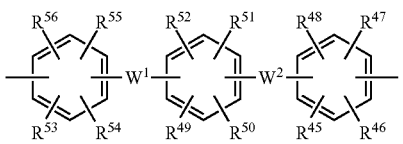
(9)

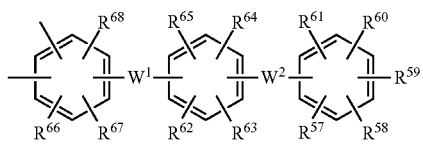
(10)

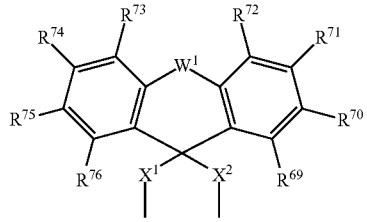
(11)

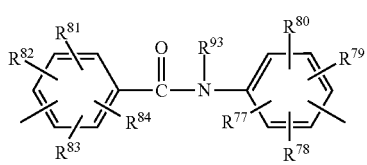
(12)

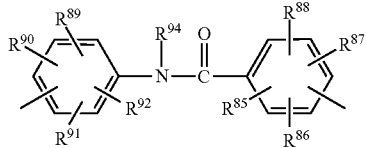
(13)

(in which $R^1$ to $R^{92}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure; $R^{93}$ and $R^{94}$ are hydrogen atoms or alkyl groups of 1 to 10 carbons which may have a branched structure; $W^1$ and $W^2$ are each independently a single bond, $CR^{95}R^{96}$ ($R^{95}$ and $R^{96}$ being each independently a hydrogen atom or an alkyl group of 1 to 10 carbons which may have a branched structure, with the proviso that $R^{95}$ and $R^{96}$ may together form a ring), C=O, O, S, SO, $SO_2$ or $NR^{97}$ ($R^{97}$ being a hydrogen atom or an alkyl group of 1 to 10 carbons which may have a branched structure); and $X^1$ and $X^2$ are each independently a single bond, an alkylene group of 1 to 10 carbons which may have a branched structure, or a group of formula (14) below

[Chemical Formula 3]

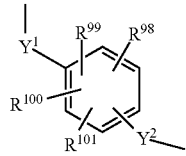

(14)

($R^{98}$ to $R^{101}$ being each independently a hydrogen atom, a halogen atom, a carboxyl group, a sulfo group, an alkyl group of 1 to 10 carbons which may have a branched structure, or an alkoxy group of 1 to 10 carbons which may have a branched structure; and $Y^1$ and $Y^2$ being each independently a single bond or an alkylene group of 1 to 10 carbons which may have a branched structure))), a crosslinking agent, and a light diffusing agent.

2. The film-forming composition of 1 above, wherein the light diffusing agent is titanium oxide, agglomerated silica particles or melamine resin-silica composite particles.
3. The film-forming composition of 2 above, wherein the light diffusing agent is titanium oxide, agglomerated silica particles or melamine resin-silica composite particles treated with a surface modifying agent.
4. The film-forming composition of 3 above, wherein the surface modifying agent is a silane coupling agent having a (meth)acryloyloxy group.
5. The film-forming composition of 3 above, wherein the surface modifying agent is a combination of a silane coupling agent and a compound having a (meth)acryloyloxy group and an isocyanate group.
6. The film-forming composition of 5 above, wherein the silane coupling agent is a silane coupling agent having an amino group.
7. The film-forming composition of 5 or 6 above, wherein the compound having a (meth)acryloyloxy group and an isocyanate group is 2-isocyanatoethyl methacrylate.
8. The film-forming composition of 1 above, wherein the light diffusing agent is an organic-inorganic composite light diffusing agent and/or an organic light diffusing agent.
9. The film-forming composition of any one of 1 to 8 above, wherein the light diffusing agent has an average particle size of from 100 nm to 3 μm.
10. The film-forming composition of any one of 1 to 9 above, wherein the crosslinking agent is a compound containing a blocked isocyanate group.
11. A light diffusing film obtained by curing the film-forming composition of any one of 1 to 10 above.
12. An organic electroluminescence device which includes the light diffusing film of 11 above.
13. A light-emitting diode which includes the light diffusing film of 11 above.
14. A film-forming composition characterized by including a triazine ring-containing hyperbranched polymer which includes recurring unit structures of formula (1) below

[Chemical Formula 4]

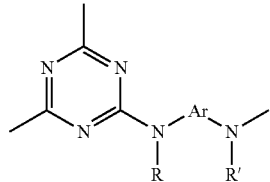

(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

[Chemical Formula 5]

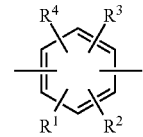

(2)

(3)

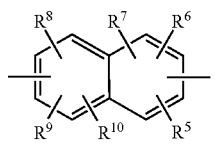

(4)

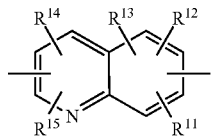

(5)

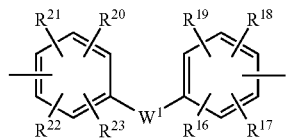

(6)

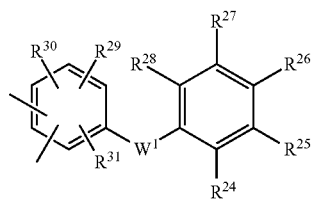

(7)

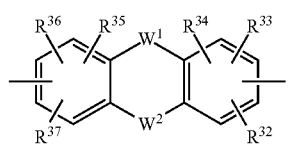

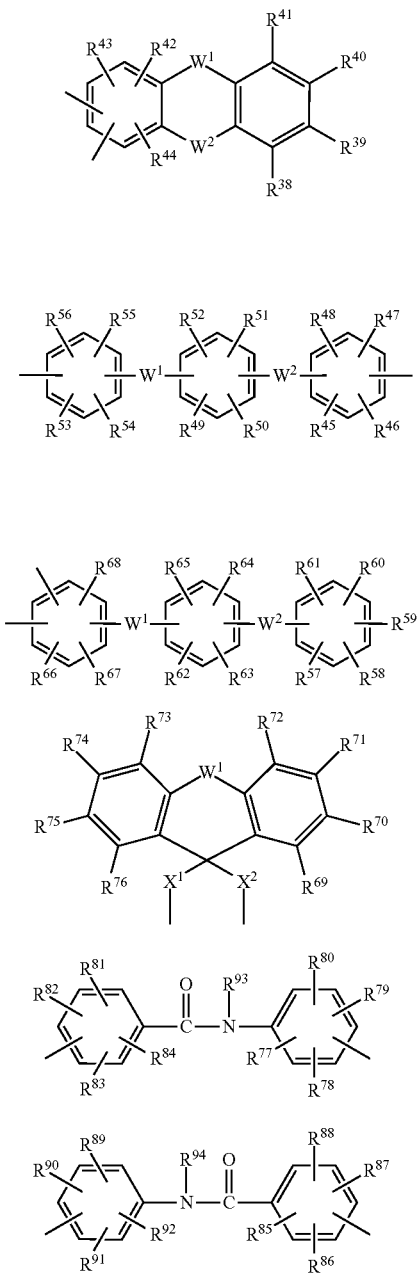

(8)

(9)

(10)

(11)

(12)

(13)

(in which $R^1$ to $R^{92}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure; $R^{93}$ and $R^{94}$ are hydrogen atoms or alkyl groups of 1 to 10 carbons which may have a branched structure; $W^1$ and $W^2$ are each independently a single bond, $CR^{95}R^{96}$ ($R^{95}$ and $R^{96}$ being each independently a hydrogen atom or an alkyl group of 1 to 10 carbons which may have a branched structure, with the proviso that $R^{95}$ and $R^{96}$ may together form a ring), C=O, O, S, SO, $SO_2$ or $NR^{97}$ ($R^{97}$ being a hydrogen atom or an alkyl group of 1 to 10 carbons which may have a branched structure); and $X^1$ and $X^2$ are each independently a single bond, an alkylene group of 1 to 10 carbons which may have a branched structure, or a group of formula (14) below

[Chemical Formula 6]

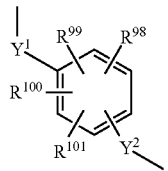

(14)

($R^{96}$ to $R^{101}$ being each independently a hydrogen atom, a halogen atom, a carboxyl group, a sulfo group, an alkyl group of 1 to 10 carbons which may have a branched structure, or an alkoxy group of 1 to 10 carbons which may have a branched structure; and $Y^1$ and $Y^2$ being each independently a single bond or an alkylene group of 1 to 10 carbons which may have a branched structure))), a crosslinking agent, and crosslinkable functional group-containing inorganic fine particles.

15. The film-forming composition of 14 above, wherein the inorganic fine particles are an oxide, sulfide or nitride of one or more metal selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium.

16. The film-forming composition of 14 above, wherein the inorganic fine particles have a primary particle size of from 2 to 50 nm and are colloidal particles of an oxide of one or more metal selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium.

17. The film-forming composition of 16 above, wherein the inorganic fine particles are colloidal particles of a $ZrO_2$-containing composite metal oxide or colloidal particles of $SiO_2$.

18. The film-forming composition of any one of 14 to 17 above, wherein the crosslinking agent is a compound having a (meth)acryl group.

19. The film-forming composition of 18 above, wherein the crosslinking agent is a polyfunctional (meth)acrylic compound.

20. A cured film obtained by curing the film-forming composition of any one of 14 to 19 above.

21. A functional film which includes a base material and the cured film of 20 above formed on the base material.

22. An electronic device which includes a base material and the cured film of 20 above formed on the base material.

23. The electronic device of 22 above, wherein the cured film is a refractive index adjusting layer.

24. The electronic device of 22 or 23 above which is an organic electroluminescent display.

Advantageous Effects of the Invention

The first film-forming composition of the invention includes a specific triazine ring-containing polymer (hyperbranched polymer), a crosslinking agent, and a light diffusing agent. Hence, a cured film with good light diffusing properties can be efficiently produced using this composition.

The second film-forming composition of the invention includes a specific triazine ring-containing polymer (hyperbranched polymer), a crosslinking agent, and crosslinking functional group-containing inorganic fine particles. Hence, a cured film characterized by having a high heat resistance, high transparency, high refractive index, high solubility and low volume shrinkage, and also having a resistance to high temperatures and high humidity, can be produced using this composition.

Because a specific triazine ring-containing polymer is used as the binder polymer, hybridization is possible without lowering the dispersibility of the inorganic fine particles. It is thus possible to produce a uniform cured film having a very high planarity even when a lot of inorganic fine particles are included therein.

Films having such properties that are produced from the film-forming compositions of the invention can be advantageously used as a component in the fabrication of electronic devices such as liquid-crystal displays, organic EL displays, touch panels, LEDs, solid-state image sensors, organic thin-film solar cells, dye-sensitized solar cells and organic thin-film transistors. In particular, cured films obtained from the first film-forming composition have excellent light-diffusing properties, and thus can be advantageously used as a light-scattering layer material in organic EL devices and LEDs. Because cured films obtained from the second film-forming composition are resistant to high temperatures and high humidity, they can be advantageously used as refractive index adjusting layers for use in lens components and electronic components required to have such resistance.

Also, any of these cured films can be advantageously used as a refractive index adjusting layer in organic EL displays, LEDs and touchscreens required to have a high refractive index. In addition to electronic material applications, use as a high-performance film required to have a high refractive index is also possible.

BRIEF DESCRIPTION OF THE DIAGRAMS

EMBODIMENT FOR CARRYING OUT THE INVENTION

Figure 1:
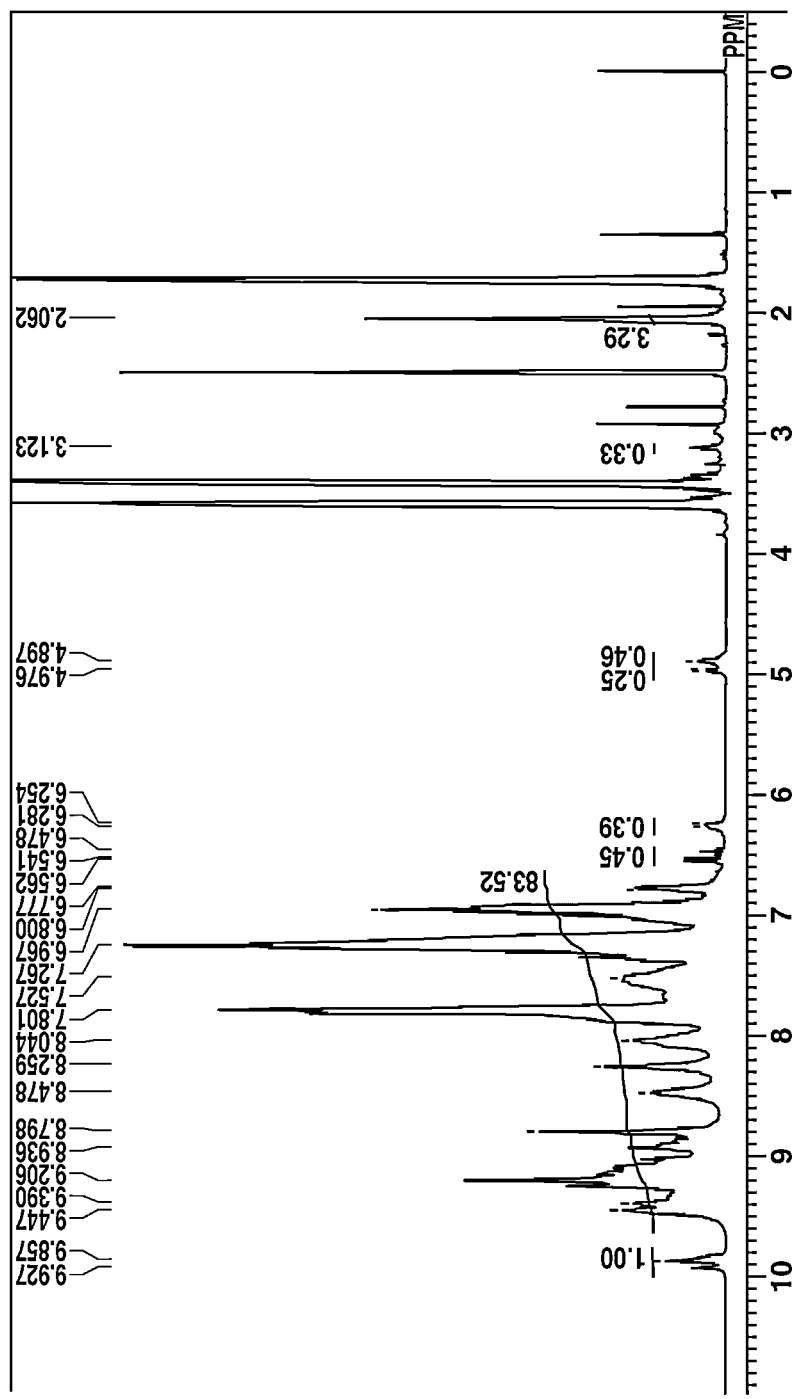
FIG. 1 is an $^1$H-NMR spectrum of the polymeric compound [3] obtained in Synthesis Example 1.

The invention is described more fully below.

The first film-forming composition of the invention includes a triazine ring-containing polymer which contains a recurring unit structure of formula (1) below, a crosslinking agent and a light diffusing agent.

The second film-forming composition of the invention includes a triazine ring-containing hyperbranched polymer which contains a recurring unit structure of formula (1) below, a crosslinking agent, and crosslinkable functional group-containing inorganic fine particles.

[Chemical Formula 7]

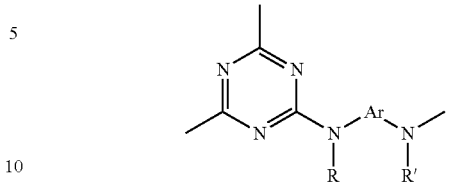

(1)

In the above formula, R and R' are each independently a hydrogen atom, an alkyl group, an alkoxy group, an aryl group or an aralkyl group.

In this invention, the number of carbons on the alkyl group, although not particularly limited, is preferably from 1 to 20. To further increase the heat resistance of the polymer, the number of carbons is more preferably from 1 to 10, and even more preferably from 1 to 3. The alkyl group may have a linear, branched or cyclic structure.

Illustrative examples of the alkyl group include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. To further increase the heat resistance of the polymer, the number of carbons is more preferably from 1 to 10, and even more preferably from 1 to 3. The alkyl moiety thereon may have a linear, branched or cyclic structure.

Illustrative examples of the alkoxy group include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. To further increase the heat resistance of the polymer, the number of carbons is more preferably from 6 to 16, and even more preferably from 6 to 13.

Illustrative examples of the aryl group include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic.

Illustrative examples of the aralkyl group include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

In above formula, Ar is at least one moiety selected from among those of formulas (2) to (13) below.

[Chemical Formula 8]

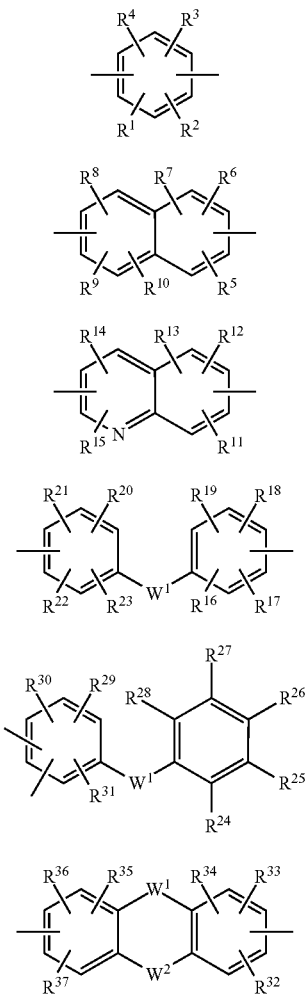

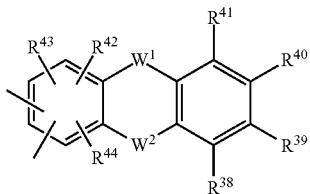

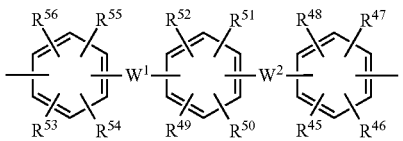

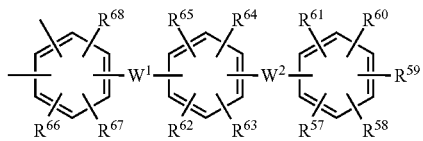

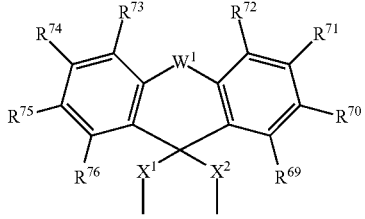

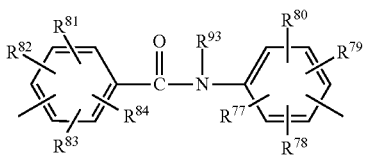

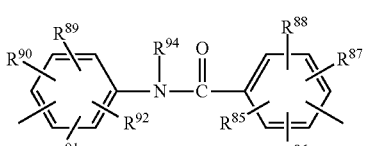

In the above formulas, $R^1$ to $R^{92}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure. $W^1$ and $W^2$ are each independently a single bond, $CR^{95}R^{96}$ (wherein $R^{95}$ and $R^{96}$ are each independently a hydrogen atom or an alkyl group of 1 to 10 carbons which may have a branched structure, with the proviso that $R^{95}$ and $R^{96}$ may together form a ring), C=O, O, S, SO, $SO_2$ or $NR^{97}$ (wherein $R^{97}$ is a hydrogen atom or an alkyl group of 1 to 10 carbons which may have a branched structure). $R^{92}$ and $R^{94}$ are hydrogen atoms or alkyl groups of 1 to 10 carbons which may have a branched structure.

Examples of the halogen atom include fluorine, chlorine, bromine and iodine.

These alkyl groups and alkoxy groups are exemplified by the same groups as mentioned above.

$X^1$ and $X^2$ are each independently a single bond, an alkylene group of 1 to 10 carbons which may have a branched structure, or a group of formula (14) below.

[Chemical Formula 9]

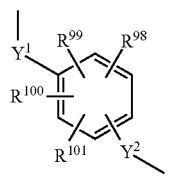
(14)

In the above formula, $R^{98}$ to $R^{101}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure. $Y^1$ and $Y^2$ are each independently a single bond or an alkylene group of 1 to 10 carbons which may have a branched structure. These halogen atoms, alkyl groups and alkoxy groups are exemplified by the same groups as mentioned above.

Illustrative examples of the alkylene group of 1 to 10 carbons which may have a branched structure include methylene, ethylene, propylene, trimethylene, tetramethylene and pentamethylene.

In particular, Ar is preferably at least one moiety selected from among moieties of formulas (2) and (5) to (13), and more preferably at least one moiety selected from among moieties of formulas (2), (5), (7), (8) and (11) to (13). Illustrative examples of aryl groups of formulas (2) to (13) include, but are not limited to, those having the following formulas.

[Chemical Formula 10]

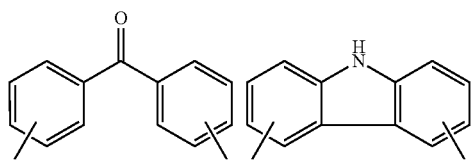

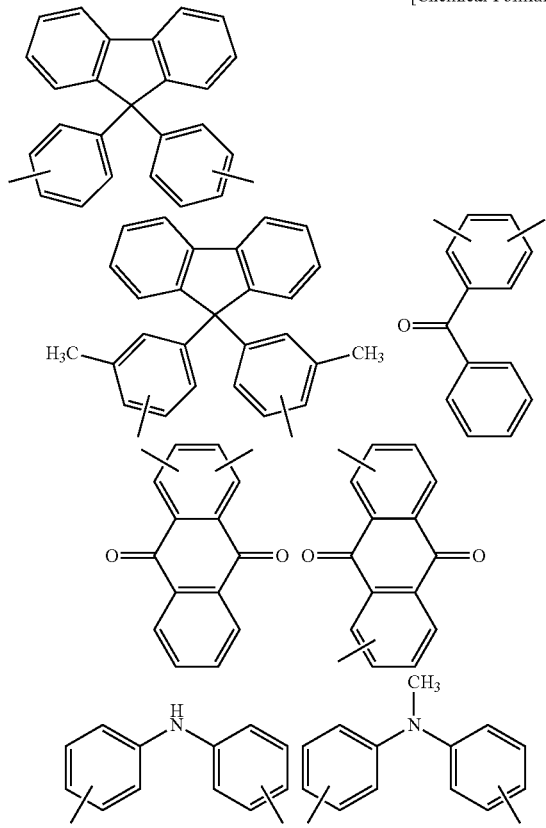

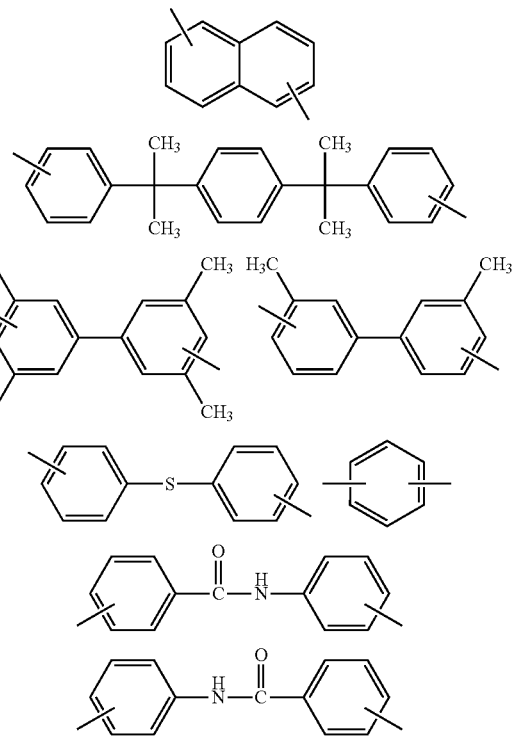

Of these, to obtain a polymer having a higher refractive index, aryl groups of the following formulas are more preferred.

[Chemical Formula 11]

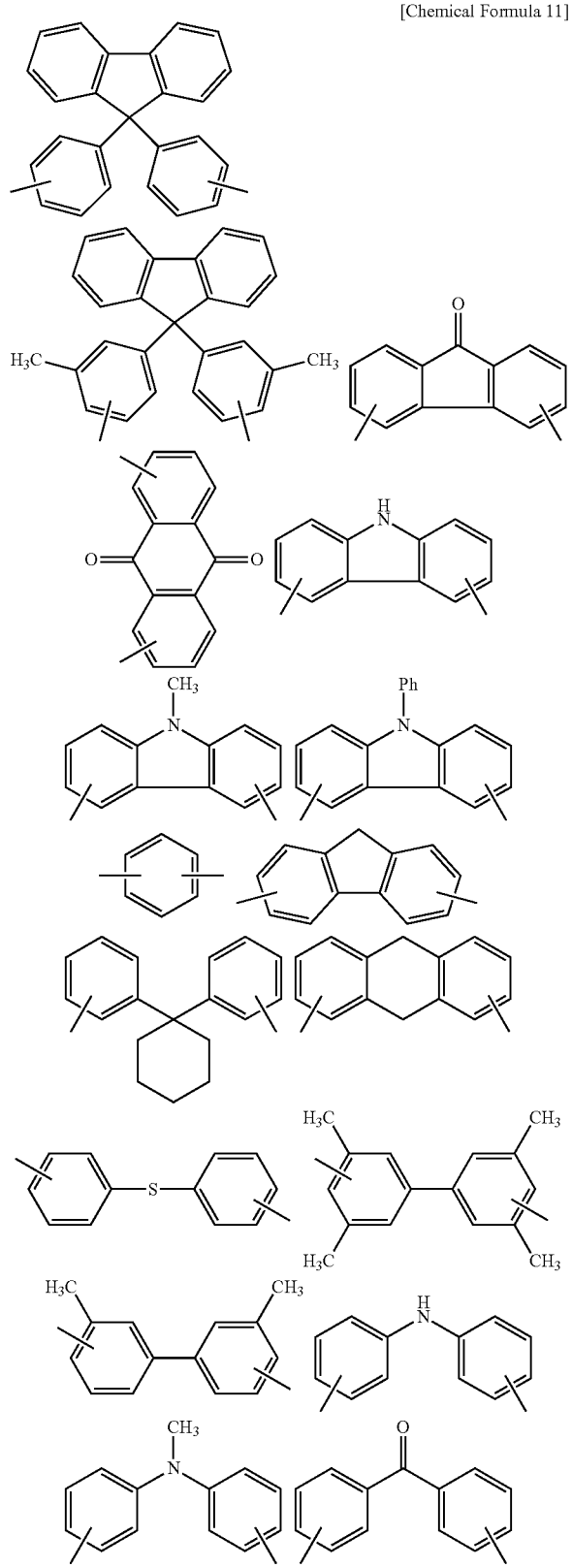

To further increase the solubility in very safe solvents such as resist solvents, it is preferable to include a recurring unit structure of formula (15) below.

[Chemical Formula 12]

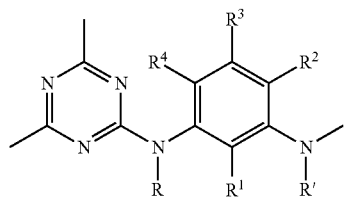

(15)

In this formula, R, R' and $R^1$ to $R^4$ are as defined above.

From such a standpoint, especially preferred recurring unit structures include those of formula (16) below, with hyperbranched polymers of formula (17) below being most preferred.

[Chemical Formula 13]

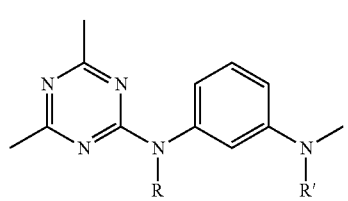

(16)

In this formula, R and R' are as defined above.

[Chemical Formula 14]

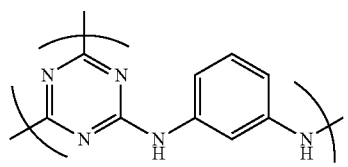

(17)

The polymer in this invention has a weight-average molecular weight which, although not particularly limited, is preferably between 500 and 500,000, and more preferably between 500 and 100,000. To further enhance the heat resistance and lower the shrinkage ratio, the weight-average molecular weight is preferably at least 2,000. To further increase the solubility and lower the viscosity of the resulting solution, the weight-average molecular weight is preferably not more than 50,000, more preferably not more than 30,000, and even more preferably not more than 10,000.

The weight-average molecular weight in the invention is the weight-average molecular weight measured by gel permeation chromatography (GPC) against a polystyrene standard.

The triazine ring-containing polymer used in this invention may be prepared by the method disclosed in above-cited Patent Document 5.

For example, as shown in Scheme 1 below, a hyperbranched polymer having the recurring structure (17') can be obtained by reacting a cyanuric halide (18) with an m-phenylenediamine compound (19) in a suitable organic solvent.

Scheme 1

[Chemical Formula 15]

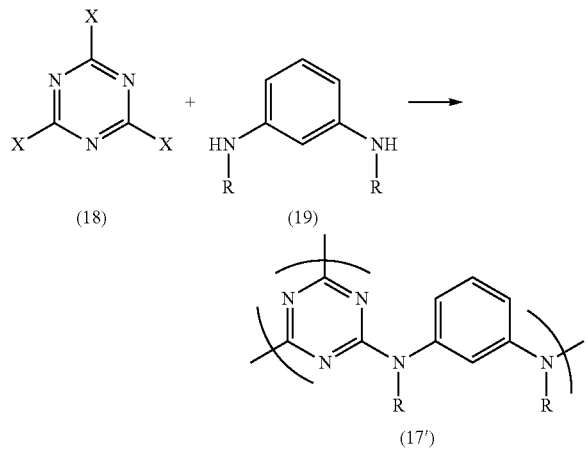

In the above formula, each occurrence of X is independently a halogen atom. R is as defined above.

As shown in Scheme 2 below, a hyperbranched polymer having the recurring structure (17') can be synthesized from a compound (20) obtained by reacting equimolar amounts of a cyanuric halide (18) and an m-phenylenediamine compound (19) in a suitable organic solvent.

Scheme 2

[Chemical Formula 16]

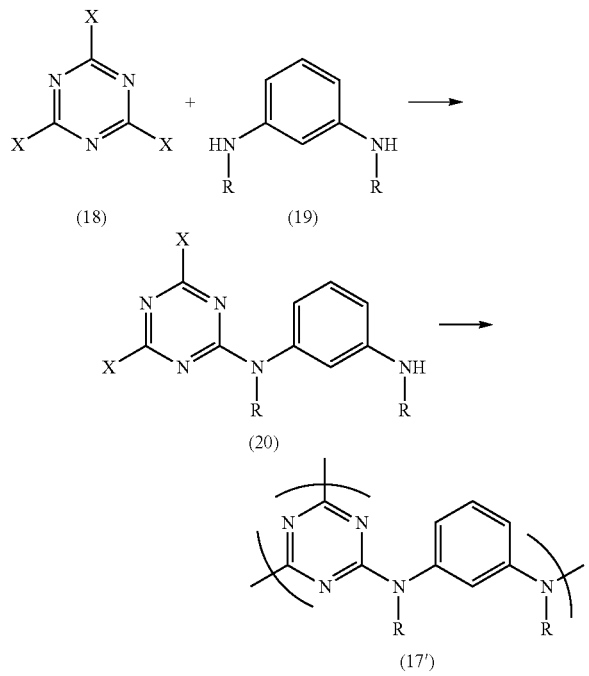

In the above formula, each occurrence of X is independently a halogen atom. R is as defined above.

In the methods of Schemes 1 and 2, the respective starting materials may be charged in any suitable amounts so long as the target polymer is obtained, although the use of from 0.01 to 10 equivalents of the diamino compound (19) per equivalent of the triazine compound (18) is preferred.

In the method of Scheme 1 in particular, it is preferable to avoid using 3 equivalents of the diamino compound (19) per 2 equivalents of the cyanuric halide (18). By including the respective functional groups in amounts that are not chemically equivalent, the formation of a gel can be prevented.

To obtain hyperbranched polymers of various molecular weights which have many terminal triazine rings, it is preferable to use the diamino compound (19) in an amount of less than 3 equivalents per 2 equivalents of the cyanuric halide (18).

On the other hand, to obtain hyperbranched polymers of various molecular weights which have many terminal amines, it is preferable to use the cyanuric halide (18) in an amount of less than 2 equivalents per 3 equivalents of the diamino compound (19).

For example, in cases where a thin film has been produced, in order for the film to have an excellent transparency and light resistance, a hyperbranched polymer having many terminal triazine rings is preferred.

By suitably regulating the amounts of the diamino compound (19) and the cyanuric halide (18) in this way, the molecular weight of the resulting hyperbranched polymer can be easily regulated.

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pryrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide, and mixed solvents thereof are preferred. N,N-Dimethylacetamide and N-methyl-2-pyrrolidone are especially preferred.

In the Scheme 1 reaction and the second stage reaction in Scheme 2, the reaction temperature may be suitably set in the range from the melting point of the solvent used to the boiling point of the solvent, although the temperature is preferably from about 0° C. to about 150° C., and more preferably from 60° C. to 100° C.

In the Scheme 1 reaction in particular, to suppress linearity and increase the degree of branching, the reaction temperature is preferably from 60° C. to 150° C., more preferably from 80° C. to 150° C., and even more preferably from 80° C. to 120° C.

In the first stage reaction of Scheme 2, the reaction temperature may be suitably set in the range from the melting point of the solvent used to the boiling point of the solvent, with a temperature of from about −50° C. to about 50° C. being preferred, a temperature of from about −20° C. to about 50° C. being more preferred, a temperature of from about −10° C. to about 50° C. being even more preferred, and a temperature of from −10° C. to 10° C. being still more preferred.

In the Scheme 2 method in particular, the use of a two-stage process consisting of a first step involving reaction at from −50° C. to 50° C., followed by a second step involving reaction at from 60° C. to 150° C. is preferred.

In each of the above reactions, the ingredients may be added in any order. However, in the Scheme 1 reaction, the best method is to heat a solution containing either the cyanuric halide (18) or the diamino compound (19) and the organic solvent to a temperature of from 60° C. to 150° C., and preferably from 80° C. to 150° C., then add the remaining ingredient—the diamino compound (19) or the cyanuric halide (18)—to the resulting solution at this temperature.

In this case, either ingredient may be used as the ingredient which is initially dissolved in the solvent or as the ingredient which is subsequently added, although a method wherein the cyanuric halide (18) is added to a heated solution of the diamino compound (19) is preferred.

In the Scheme 2 reactions, either ingredient may be used as the ingredient which is initially dissolved in the solvent or as the ingredient which is subsequently added, although a method wherein the diamino compound (19) is added to a cooled solution of the cyanuric halide (18) is preferred.

The subsequently added ingredient may be added neat or may be added as a solution of the ingredient dissolved in an organic solvent such as any of those mentioned above. However, taking into account the ease of operation and the controllability of the reaction, the latter approach is preferred.

Also, addition may be carried out gradually such as in a dropwise manner, or the entire amount may be added all at once in a batchwise manner.

In Scheme 1, even when the reaction is carried out in a single stage after both compounds have been mixed together in a heated state (that is, without raising the temperature in a stepwise fashion), the desired triazine ring-containing hyperbranched polymer can be obtained without gelation.

In the Scheme 1 reaction and the second stage reaction in Scheme 2, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (18) is preferably from 1 to 100 equivalents, and more preferably from 1 to 10 equivalents. These bases may be used in the form of an aqueous solution.

In the methods of both schemes, following reaction completion, the product can be easily purified by a suitable technique such as reprecipitation.

Also, in the present invention, some portion of the halogen atoms on at least one terminal triazine ring may be capped with, for example, an alkyl, aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred. Arylamino groups are even more preferred.

The above alkyl groups and alkoxy groups are exemplified in the same way as described earlier in the specification.

Illustrative examples of ester groups include methoxycarbonyl and ethoxycarbonyl.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, methylphenylmethyloxy, p-ethylphenylmethyloxy, 2-propylphenylmethyloxy, 4-isopropylphenylmethyloxy, 4-isobutylphenylmethyloxy and α-naphthylmethyloxy.

These groups can be easily introduced by substituting a halogen atom on a triazine ring with a compound that furnishes the corresponding substituent. For example, as shown in Scheme 3 below, by adding an aniline derivative and inducing a reaction, a hyperbranched polymer (21) having a phenylamino group on at least one end is obtained.

Scheme 3

[Chemical Formula 17]

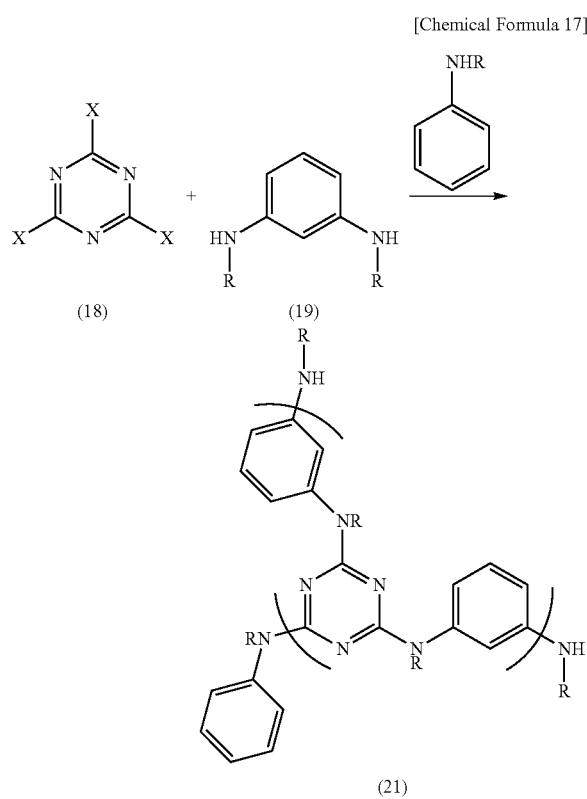

In these formulas, X and R are as defined above.

At this time, by reacting the cyanuric halide with a diaminoaryl compound while at the same time charging an organic monoamine, that is, in the presence of an organic monoamine, it is possible to obtain a flexible hyperbranched polymer having a low degree of branching in which the rigidity of the hyperbranched polymer has been diminished.

Because the hyperbranched polymer obtained in this way has an excellent solubility in a solvent (meaning that agglomeration is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylbenzylamine, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C.

However, mixing of the three ingredients—an organic monoamine, a cyanuric halide and a diaminoaryl compound—may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to raise the temperature without interruption (i.e., in a single step) to the polymerization temperature and carry out the reaction.

Alternatively, the mixing of two ingredients—a cyanuric halide and a diaminoaryl compound—may be carried out at a low temperature, in which case the temperature is set to preferably from about −50° C. to about 50° C., more preferably from about −20° C. to about 50° C., and even more preferably from −20° C. to 10° C. After low-temperature charging, it is preferable to add the organic monoamine, raise the temperature without interruption (i.e., in a single step) to the polymerization temperature and carry out the reaction.

The reaction of the cyanuric halide with the diaminoaryl compound in the presence of such an organic monoamine may be carried out using an organic solvent like those mentioned above.

The first film-forming composition of the invention has a crosslinking agent included therein for the purpose of, e.g., increasing the hardness of the resulting cured film. The second film-forming composition of the invention has a crosslinking agent included therein for the purpose of, e.g., increasing the resistance to high temperatures and high humidity of the resulting cured film.

The crosslinking agent is not particularly limited, provided it is a compound having substituents capable of reacting with the polymer or with crosslinkable functional groups on the inorganic fine particles used in the invention.

Such compounds are exemplified by melamine compounds having a crosslink-forming substituent such as a methylol group or a methoxymethyl group, substituted urea compounds, compounds having a crosslink-forming substituent such as an epoxy group or an oxetane group, compounds containing a blocked isocyanate group, compounds containing an acid anhydride group, compounds having a (meth)acryl group, and phenoplast compounds. From the standpoint of heat resistance and storage stability, compounds having a blocked isocyanate group or a (meth) acryl group are preferred. Compounds having a blocked isocyanate group, and polyfunctional epoxy compounds and/or polyfunctional (meth)acrylic compounds which provide photocurable compositions even without the use of an initiator are especially preferred.

In cases where such compounds are used in the end group treatment of polymers, they should have at least one crosslink-forming substituent on the molecule. In cases where they are used in crosslinking treatment between polymers, these compounds must have at least two crosslink-forming substituents on the molecule.

The polyfunctional epoxy compounds are not particularly limited, provided they have two or more epoxy groups on the molecule.

Illustrative examples include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxyl)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180575 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The polyfunctional (meth)acrylic compounds are not particularly limited, provided they have two or more (meth) acryl groups on the molecule.

Illustrative examples include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The polyfunctional (meth)acrylic compound may be acquired as a commercial product, illustrative examples of which include NK Ester A-200, A-400, A-600, A-1000, A-9300 (tris[2-(acryloyloxy)ethyl]isocyanurate), A-9300-1CL, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3E0, A-TMPT-9E0, ATM-4E and ATM-35E (all from Shin-Nakamura Chemical Co., Ltd.); KAYARAD® DPEA-12, PEG400DA, THE-330 and RP-1040 (all from Nippon Kayaku Co., Ltd.); M-210 and M-350 (from Toagosei Co., Ltd.); KAYARAD® DPHA, NPGDA and PET30 (Nippon Kayaku Co., Ltd.); NK Ester A-DPH, A-TMPT, A-DCP, A-HD-N, TMPT, DCP, NPG and HD-N (all from Shin-Nakamura Chemical Co., Ltd.); NK Oligo U-15HA (Shin-Nakamura Chemical Co., Ltd.); and NK Polymer Vanaresin GH-1203 (Shin-Nakamura Chemical Co., Ltd.).

The acid anhydride compounds are not particularly limited, provided they are carboxylic acid anhydrides obtained by the dehydration/condensation of two molecules of carboxylic acid. Illustrative examples include those having one acid anhydride group on the molecule, such as phthalic to anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and those having two acid anhydride groups on the molecule, such 1,2,3,4-cyclobutanetetracarboxylic dianhydride, pyromellitic anhydride, 3,4-dicarboxy-1,2,3,4-tetrahydro-1-naphthalene-succinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The compounds containing blocked isocyanate groups are not particularly limited, provided they are compounds having on the molecule at least two blocked isocyanate groups, i.e., isocyanate groups (—NCO) that have been blocked with suitable protecting groups, and in which, upon exposure of the compound to an elevated temperature during heat curing, the protecting groups (blocking moieties) are removed by thermal dissociation and the isocyanate groups that form as a result induce crosslinking reactions with the resin. Such compounds are exemplified by compounds having on the molecule at least two groups of the following formula (which groups may be the same or may each differ).

[Chemical Formula 18]

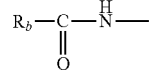

In the formula, $R_b$ is an organic group on the blocking moiety.

Such a compound can be obtained by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanate groups may also be acquired as a commercial product, illustrative examples of which include B-830, B-815N, B-842N, B-870N, B-874N, B-882N, B-7005, B7030, B-7075 and B-5010 (all from Mitsui Chemicals, Inc.); Duranate® 17B-60PX, TPA-B80E, MF-B60X, MF-K60X and E402-B80T (all from Asahi Kasei Chemicals Corporation); and Karenz MOI-BM™ (Showa Denko KK).

The aminoplast compounds are not particularly limited, provided they are compounds which have at least two methoxymethylene groups on the molecule. Illustrative examples include the following melamine compounds: compounds of the Cymel® series, such as hexamethoxymethylmelamine (Cymel® 303), tetrabutoxymethylglycoluril (Cymel® 1170) and tetramethoxymethylbenzoguanamine (Cymel® 1123) (all from Nihon Cytec Industries, Inc.); and compounds of the Nikalac® series, including the methylated melamine resins Nikalac® MW-30HM, MW-390, MW-100LM and MX-750LM, and the methylated urea resins Nikalac® MX-270, MX-280 and MX-290 (all from Sanwa Chemical Co., Ltd.).

The oxetane compounds are not particularly limited, provided they are compounds which have at least two oxetanyl groups on the molecule. Examples include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the polymer of the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl) formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

Of these, in terms of an ability to suppress a decline in refractive index by including the crosslinking agent and also rapid promotion of the curing reaction, polyfunctional (meth)acrylic compounds are preferred. In particular, owing to their excellent compatibility with triazine ring-containing polymers, polyfunctional (meth)acrylic compounds having the isocyanuric acid skeleton described below are more preferred.

Polyfunctional (meth)acrylic compounds having such skeletons are exemplified by NK Ester A-9300 and A-9300-1CL (both of which are from Shin-Nakamura Chemical Co., Ltd.).

[Chemical Formula 19]

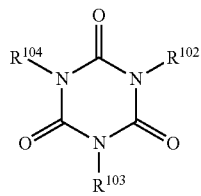

In the above formula, $R^{102}$ to $R^{104}$ are each independently a monovalent organic group having at least one terminal (meth)acryl group.

To further enhance the rate of cure and also increase the solvent resistance, acid resistance and alkali resistance of the resulting cured film, it is advantageous to use a polyfunctional (meth)acrylic compound which at 25° C. is a liquid and has a viscosity of 5,000 mPa·s or less, preferably from 1 to 3,000 mPa·s, more preferably from 1 to 1,000 mPa·s, and even more preferably from 1 to 500 mPa·s (referred to below as a "low-viscosity crosslinking agent"), either singly or as a combination of two or more thereof, or in combination with the above-described polyfunctional (meth)acrylic compound having an isocyanuric acid skeleton.

Such a low-viscosity crosslinking agent too may be acquired as a commercial product. Illustrative examples include, of the above-mentioned polyfunctional (meth)acrylic compounds, crosslinking agents in which the chain lengths between (meth)acryl groups are relatively long, such as NK Ester A-GLY-3E (85 mPa·s at 25° C.), A-GLY-9E (95 mPa·s at 25° C.), A-GLY-20E (200 mPa·s at 25° C.), A-TMPT-3E0 (60 mPa·s at 25° C.), A-TMPT-9E0, ATM-4E (150 mPa·s at 25° C.) and ATM-35E (350 mPa·s at 25° C.) (all from Shin-Nakamura Chemical Co., Ltd.).

In addition, to enhance the alkali resistance of the resulting cured film, it is preferable to use a combination of NK Ester A-GLY-20E (Shin-Nakamura Chemical Co., Ltd.) and the above-described polyfunctional (meth)acrylic compound having an isocyanuric acid skeleton.

The above crosslinking agent may be used singly or two or more may be used in combination. The amount of crosslinking agent used per 100 parts by weight of the triazine ring-containing polymer is preferably from 1 to 100 parts by weight. From the standpoint of solvent resistance, the lower limit is preferably 2 parts by weight, and more preferably 5 parts by weight. From the standpoint of control of the refractive index, the upper limit is preferably 30 parts by weight, more preferably 20 parts by weight, and even more preferably 15 parts by weight.

Initiators corresponding to the respective crosslinking agents may also be included in the film-forming compositions of the invention. As noted above, when a polyfunctional epoxy compound and/or a polyfunctional (meth)acrylic compound are used as crosslinking agents, photocuring is promoted even without the use of an initiator, giving a cured film, although it is acceptable to use an initiator in such cases.

In cases where a polyfunctional epoxy compound is used as the crosslinking agent, a photoacid generator or a photobase generator may be used as the initiator.

The photoacid generator used may be one that is suitably selected from among known photoacid generators. For example, use may be made of onium salt derivatives such as diazonium salts, sulfonium salts and iodonium salts.

Illustrative examples include aryldiazonium salts such as phenyldiazonium hexafluorophosphate, 4-methoxyphenyldiazonium hexafluoroantimonate and 4-methylphenyldiazonium hexafluorophosphate; diaryliodonium salts such as diphenyliodonium hexafluoroantimonate, di(4-methylphenyl)iodonium hexafluorophosphate and di(4-tert-butylphenyl)iodonium hexafluorophosphate; and triarylsulfonium salts such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenylsulfide bishexafluoroantimonate, 4,4'-bis[di(β-hydroxyethoxy)phenylsulfonio]phenylsulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

Commercial products may be used as these onium salts. Illustrative examples include San-Aid SI-60, SI-80, SI-100, SI-60L, SI-80L, SI-100L, SI-L145, SI-L150, SI-L160, SI-L110 and SI-L147 (all available from Sanshin Chemical Industry Co., Ltd.); UVI-6950, UVI-6970, UVI-6974, UVI-6990 and UVI-6992 (all available from Union Carbide); CPI-100P, CPI-100A, CPI-200K and CPI-200S (all available from San-Apro Ltd.); Adeka Optomer SP-150, SP-151, SP-170 and SP-171 (all available from Adeka Corporation); Irgacure 261 (BASF); CI-2481, CI-2624, CI-2639 and CI-2064 (Nippon Soda Co., Ltd.); CD-1010, CD-1011 and CD-1012 (Sartomer Company); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all from Midori Kagaku Co., Ltd.); PCI-061T, PCI-062T, PCI-020T and PCI-022T (all from Nippon Kayaku Co., Ltd.); and IBPF and IBCF (Sanwa Chemical Co., Ltd.).

The photobase generator used may be one selected from among known photobase generators. For example, use may be made of Co-amine complex-type, oxime carboxylic acid ester-type, carbamic acid ester-type and quaternary ammonium salt-type photobase generators.

Illustrative examples include 2-nitrobenzylcyclohexyl carbamate, triphenylmethanol, O-carbamoylhydroxylamide, O-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

A commercial product may be used as the photobase generator. Illustrative examples include TPS-OH, NBC-101 and ANC-101 (all available under these product names from Midori Kagaku Co., Ltd.).

In cases where a photoacid or photobase generator is used, the generator is used in the range of preferably 0.1 to 15 parts by weight, and more preferably 1 to 10 parts by weight, per 100 parts by weight of the polyfunctional epoxy compound.

Also, from 1 to 100 parts by weight of an epoxy resin curing agent may optionally be included per 100 parts by weight of the polyfunctional epoxy compound.

In cases where a polyfunctional (meth)acrylic compound is used, a photoradical initiator may also be used.

A known photoradical initiator may be suitably selected and used for this purpose. Exemplary photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of Saishin UV K•ka Gijutsu [Recent UV Curing Technology] (publisher, K. Takausu; published by Gijutsu Joho Kyokai KK; 1991).

Examples of commercial photoradical initiators include those available from BASF under the trade names Irgacure 184, 369, 651, 500, 819, 907, 784, 2959, CGI1700, CGI1750, CGI1850 and CG24-61, and the trade names Darocur 1116 and 1173; that available from BASF under the trade name Lucirin TPO; that available from UCB under the trade name Ubecryl P36; and those available under the trade names Esacure KIP150, KIP65LT, KIP100F, KT37, KT55, KT046 and KIP75/B from the Fratelli Lamberti Company.

The photoradical initiator is used in the range of preferably from 0.1 to 15 parts by weight, and more preferably from 1 to 10 parts by weight, per 100 parts by weight of the polyfunctional (meth)acrylic compound.

The first film-forming composition of the invention additionally includes a light diffusing agent in order to increase the light diffusing properties of the resulting cured film.

The light diffusing agent is not particularly limited, the use of an organic-inorganic composite light diffusing agent, an organic light diffusing agent or an inorganic light diffusing agent being possible. Such light diffusing agents may be used singly, combinations of two or more light diffusing agents of one of these types may be used in combination, or two or more light diffusing agents of different types may be used in combination.

Exemplary organic-inorganic composite light diffusing agents include melamine resin-silica composite particles. Such organic-inorganic composite light diffusing agents that are commercially available include, for example, the melamine resin-silica composite particles available as Optbeads® 500S (from Nissan Chemical Industries, Ltd.).

Organic-inorganic composite light diffusing agents such as these melamine resin-silica composite particles are preferably used after treatment with a surface modifying agent.

In this case, the surface modifying agent is not particularly limited, provided it is able to increase compatibility between the matrix resin and the light diffusing agent. However, taking into account the fact that the matrix resin is a triazine ring-containing polymer, the combined use of a silane coupling agent and a compound having a (meth)acryloyloxy group and an isocyanate group is preferred.

The silane coupling agent is not particularly limited, although preferred use can be made of, for example, silane coupling agents having an amino group and silane coupling agents having a thiol group. Of these, silane coupling agents having an amino group are more preferred.

Illustrative examples of silane coupling agents having an amino group include 3-aminopropyltrimethoxysilane, 3-aminopropyltriethoxysilane, 3-aminopropylmethyldimethoxysilane, 3-aminopropyldimethylmethoxysilane, 3-aminopropylmethyldiethoxysilane, 3-aminopropyldimethylethoxysilane, N-phenyl-3-aminopropyltrimethoxysilane and N-phenyl-3-aminopropyltriethoxysilane.

Illustrative examples of silane coupling agents having a thiol group include 3-mercaptopropyltrimethoxysilane, 3-mercaptopropyltriethoxysilane, mercaptomethyldimethylethoxysilane, (mercaptomethyl)methyldiethoxysilane and 3-mercaptopropylmethyldimethoxysilane.

The compound having a (meth)acryloyloxy group ((meth) acryloxy group) and an isocyanate group is not particularly limited, provided it is a compound having both of these functional groups.

Illustrative examples include 2-isocyanatoethyl acrylate, 2-isocyanatoethyl methacrylate, 1,1-(bisacryloyloxymethyl) ethyl isocyanate, and compounds in which these isocyanate groups are blocked.

Illustrative examples of commercially available compounds of this type include Karenz AOI® (2-isocyanatoethyl acrylate), Karenz MOI® (2-isocyanatoethyl methacrylate), Karenz BEI® (1,1-(bisacryloyloxymethyl)ethyl isocyanate), Karenz MOI-BM® (2-(O-[1'-methylpropylideneamino]carboxy-amino)ethyl methacrylate, a blocked isocyanate compound of Karenz MOI), Karenz MOI-BP® (2-[(3,5-dimethylpyrazolyl)-carbonylamino]ethyl methacrylate, a blocked isocyanate compound of Karenz MOI), and Karenz MOI-EG® (all available from Showa Denko K.K.).

The surface modifying method is not particularly limited. Suitable use may be made of a hitherto known method, such as the method of mixing together an organic-inorganic composite light diffusing agent, a silane coupling agent and a compound having both a (meth)acryloyloxy group and an isocyanate group in a suitable solvent, and stirring under applied heat.

In this case, the silane coupling agent and the compound having a (meth)acryloyloxy group and an isocyanate group are used in a ratio such that the molar ratio of amino groups or thiol groups (referred to below as "active hydrogen groups") in the silane coupling agent to isocyanate groups (referred to below as "NCO groups") in the compound having both a (meth)acryloyloxy group and an isocyanate group, expressed as "active hydrogen groups/NCO," is in the range of preferably 0.1/10 to 15/10, and is most preferably 1/1.

The amount of surface treatment agent used with respect to the light diffusing agent, expressed as the total amount of surface treatment agent per 100 parts by weight of the light diffusing agent, is preferably from 1 to 150 parts by weight, and more preferably from 10 to 100 parts by weight.

The solvent may be any having an ability to disperse particles. Illustrative examples solvents include water, toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide (DMAc), N-methylpyrrolidone, 1,3-dimethyl-2-imidazolidinone, dimethylsulfoxide and N-cyclohexyl-2-pyrrolidinone. These may be used singly or two or more may be used in combination.

Following surface treatment, the surface-treated light diffusing agent may be removed and used or may be used directly as a dispersion. When used as a dispersion, the solids content therein is not particularly limited, but may be set to from about 0.1 wt % to about 50 wt %.

During such surface modification, in order to further increase the dispersibility of the resulting surface-modified light diffusing agent, the light diffusing agent prior to surface modification may be dispersed beforehand in the above-described solvent so as to prepare a dispersion, and surface modification carried out by adding the surface modifying agent to this dispersion.

The dispersion treatment method is not particularly limited. For example, use may be made of ultrasonic treatment or wet jet mill treatment.

The solids content of the dispersion in this case is not particularly limited, and may be set to from about 0.1 wt % to about 50 wt %.

Illustrative examples of organic light diffusing agents include crosslinked polymethyl methacrylate (PMMA) particles, crosslinked polymethyl acrylate particles, crosslinked polystyrene particles, crosslinked styrene-acrylate copolymer particles, melamine-formaldehyde particles, silicone resin particles, silica-acrylic composite particles, nylon particles, benzoguanamine-formaldehyde particles, benzoguanamine-melamine-formaldehyde particles, fluororesin particles, epoxy resin particles, polyphenylene sulfide resin particles, polyethersulfone resin particles, polyacrylonitrile particles and polyurethane particles. Illustrative examples of commercial products of such organic light diffusing agents include the following crosslinked PMMA particles: MX-150 (from Soken Chemical & Engineering Co., Ltd.), the Techpolymer SSX Series (Sekisui Plastics Co., Ltd.) and the Taftic® FH-S Series (Toyobo Co., Ltd.); crosslinked styrene-acrylate hollow particles (NANOTEX, available from JSR Corporation), silicone resin particles of the Tospearl Series (from Momentive) and the KMP Series (Shin-Etsu Chemical Co., Ltd.), polystyrene and polymethacrylic acid ester particles of the Ganzpearl Series (Gantz Kasei KK), Soliostar RA and SP (silica-acrylic composite particles available from Nippon Shokubai Co., Ltd.), Amilan (nylon particles from Toray Industries, Inc.), Epostar MS, M05 and L15 (benzoguanamine-formaldehyde particles from Nippon Shokubai Co., Ltd.), Epostar M30 (benzoguanamine-melamine-formaldehyde particles from Nippon Shokubai Co., Ltd.), Fluon PTFE dispersions of fluororesin particles (Asahi Glass Co., Ltd.), Toraypearl EP (epoxy resin particles from Toray Industries, Inc.), Toraypearl PPS (polyphenylene sulfide resin particles from Toray Industries, Inc.), Toraypearl PES (polyethersulfone resin particles from Toray Industries, Inc.), Taftic F Series F-120 (polyacrylonitrile particles form Toyobo Co., Ltd.), and Art Pearl crosslinked urethane beads MM (polyurethane particles from Negami Chemical Industrial Co., Ltd.).

Illustrative examples of inorganic light diffusing agents include calcium carbonate ($CaCO_3$), titanium oxide ($TiO_2$), barium sulfate ($BaSO_4$), aluminum hydroxide ($Al(OH)_3$), silica ($SiO_2$) and talc. From the standpoint of further increasing the light diffusing properties of the resulting cured film, titanium oxide ($TiO_2$) and agglomerated silica particles are preferred, with non-agglomerated titanium oxide ($TiO_2$) being more preferred. Of these, inorganic light diffusing agents that have been surface treated with a (meth)acryloyloxy group-containing silane coupling agent, and especially ones that have been surface treated with a (meth)acryloyloxy group-containing trialkoxysilane surface modifying agent such as 3-acryloyloxypropyltrimethoxysilane, 3-methacryloxypropyltrimethoxysilane, 3-acryloyloxypropyltriethoxysilane, 3-methacryloxypropyltriethoxysilane, 3-acryloyloxypropylmethyldimethoxysilane, 3-methacryloxypropylmethyldimethoxysilane, 3-acryloyloxypropyldimethylmethoxysilane, 3-methacryloxypropyldimethylmethoxysilane, 3-acryloyloxypropylmethyldiethoxysilane, 3-methacryloxypropylmethyldiethoxysilane, 3-acryloyloxypropyldimethylethoxysilane and 3-methacryloxypropyldimethylethoxysilane are especially preferred.

These surface modifying agents are used in an amount which is not particularly limited, although use in an amount of about 1.0 to about 5.0 molecules of surface modifying agent per square nanometer of surface on the titanium oxide ($TiO_2$) or silica particles is preferred.

From the standpoint of increasing the dispersibility in the triazine ring-containing polymer serving as the matrix resin, the titanium oxide ($TiO_2$) or agglomerated silica particles are preferably used in the form of an organic solvent dispersion. In this case, the organic solvent, although not particularly limited, is exemplified by the organic solvents mentioned above as examples of solvents for surface treating the organic-inorganic composite light diffusing agent. Preferred solvents for preparing a dispersion of titanium oxide include ketone solvents such as acetone, methyl ethyl ketone, methyl isopropyl ketone, diethyl ketone, methyl isobutyl ketone, methyl n-butyl ketone and cyclohexanone. Preferred solvents for preparing a dispersion of agglomerated silica include glycol ether solvents such as ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether and diethylene glycol monoethyl ether acetate.

The solids content is not particularly limited, and may be set to from about 0.1 wt % to about 50 wt %.

Examples of commercially available agglomerated silica particles include Lightstar LA-S26 (Nissan Chemical Industries, Ltd.), which is an alkaline dispersion of agglomerated silica particles. When used as an organic solvent dispersion, this may be used after solvent substitution by a suitable method.

In addition, to increase the storage stability of the first film-forming composition of the invention, an amine compound may be added to and used in the dispersion of agglomerated silica particles. The amine compound used for this purpose is not particularly limited, and may be suitably selected from among various aliphatic and aromatic amine compounds. Examples of the amine compound are given below.

Illustrative examples of aliphatic primary amine compounds include propylamine, isopropylamine, butylamine, amylamine, hexylamine, heptylamine, octylamine, nonylamine, decylamine, undecylamine, dodecylamine, tridecylamine, tetradecylamine, pentadecylamine, cetylamine, cyclopropylamine, cyclobutylamine, cyclopentylamine, cyclohexylamine, allylamine, monoethanolamine and benzylamine.

Illustrative examples of aliphatic secondary amine compounds include diethylamine, dipropylamine, diisopropylamine, dibutylamine, diamylamine, dioctylamine, diallylamine, distearylamine, diethanolamine, dicyclohexylamine, N-butylethanolamine and diethylbenzylamine.

Illustrative examples of aliphatic tertiary amine compounds include triethylamine, tripropylamine, tributylamine, triamylamine, trioctylamine, triallylamine, N-ethyldiethanolamine, N-ethyldipropylamine, N-ethyldiisopropylamine, N-octyldimethylamine, N,N-dimethyldecylamine, N,N-dimethyldodecylamine, N,N-dimethylmyristylamine, N,N-dibutylethanolamine, triethanolamine, N,N-dimethylethanolamine and tribenzylamine.

Illustrative examples of aromatic amine compounds include aniline, methylaniline, N,N-dimethylaniline, ethylaniline, N,N-diethylaniline, o-toluidine, m-toluidine, p-toluidine, diphenylamine, triphenylamine, α-naphthylamine and β-naphthylamine.

From the standpoint of increasing the storage stability of the first film-forming composition of the invention, of the above amine compounds, a tertiary amine is preferred. Of these, N-ethyldiisopropylamine, tributylamine, N-octyldimethylamine, triamylamine and N,N-dimethyldodecylamine are more preferred.

From the standpoint of increasing the storage stability of the first film-forming composition of the invention, these amine compounds are added in an amount with respect to the agglomerated silica particles included in the dispersion which is preferably at least 0.01 wt % and not more than 5 wt %, more preferably at least 0.1 wt % and not more than 2 wt %, and most preferably at least 0.4 wt % and not more than 1 wt %.

Of the various above light dispersing agents, from the standpoint of increasing the light dispersing properties of the resulting cured film, titanium oxide ($TiO_2$) is preferred. Moreover, from the standpoint of increasing the dispersion stability of the titanium oxide dispersion and increasing the ease of operations such as filterability, non-agglomerated titanium oxide ($TiO_2$) that has been surface treated with a (meth)acryloyloxy group-containing trialkoxysilane surface modifying agent is most preferred.

The average particle size of the light diffusing agent is not particularly limited, although from the standpoint of further increasing the dispersibility, making the resulting cured film thinner and further increasing the planarity of the cured film, the average particle size is preferably not more than 3 μm, more preferably not more than 2 μm, and even more preferably not more than 1 μm. From the standpoint of having the resulting cured film exhibit sufficient light diffusing properties, the average particle size is preferably at least 100 nm, more preferably at least 150 nm, and even more preferably at least 200 nm.

The average particle size (μm) is the 50% volume diameter (median diameter) obtained by measurement using a laser diffraction scattering method based on the Mie theory, and can be measured with, for example, a Mastersizer® 2000 from Malvern Instruments.

The amount of light diffusing agent used is not particularly limited. However, from the standpoint of further increasing the light scattering efficiency of the resulting cured film, the lower limit per 100 parts by weight of the triazine ring-containing polymer is preferably 1 part by weight, more preferably 5 parts by weight, and even more preferably 30 parts by weight. From the standpoint of suppressing a decrease in the light transmittance of the cured film and suppressing a decline in the film-forming properties, the upper limit is preferably 250 parts by weight, more preferably 200 parts by weight, and even more preferably 150 parts by weight.

The second film-forming composition of the invention includes crosslinkable functional group-containing inorganic fine particles in order to increase the resistance of the resulting cured film to high temperatures and humidity.

The inorganic fine particles are not particularly limited, although oxides, sulfides or nitrides of one, two or more metals selected from among beryllium (Be), aluminum (Al), silicon (Si), titanium (Ti), vanadium (V), iron (Fe), copper (Cu), zinc (Zn), yttrium (Y), zirconium (Zr), niobium (Nb), molybdenum (Mo), indium (In), tin (Sn), antimony (Sb), tantalum (Ta), tungsten (W), lead (Pb), bismuth (Bi) and cerium (Ce) are preferred, with oxides of these metals being especially preferred.

A single type of inorganic fine particle may be used alone or two or more types may be used in combination.

Illustrative examples of suitable metal oxides include $Al_2O_3$, ZnO, $TiO_2$, $ZrO_2$, $Fe_2O_3$, $Sb_2O_5$, BeO, ZnO, $SnO_2$, $CeO_2$, $SiO_2$ and $WO_3$. Of these, $ZrO_2$ and $SiO_2$ are preferred.

Using a plurality of metal oxides as a mixed oxide is also effective. As used herein, "mixed oxide" refers to the product obtained by mixing two or more different inorganic oxides at the stage of fine particle production. Illustrative examples include mixed oxides of $TiO_2$ with $ZrO_2$, $TiO_2$ with $ZrO_2$ and $SnO_2$, and $ZrO_2$ with $SnO_2$. Of these, a mixed oxide of $ZrO_2$ with $SnO_2$ is preferred. Such mixed oxides can be prepared by a known method such as the method described in WO 2011/090084.

Other compounds of the above metals may also be used as the metal oxide. Examples include $ZnSb_2O_6$, $BaTiO$, $SrTiO_3$ and $SrSnO_3$. These compounds may be used singly or two or more may be used in admixture. These compounds may also be used in admixture with the above oxides.

The particle size of the inorganic fine particles is not particularly limited. However, from the standpoint of further increasing the dispersibility in a dispersion, the primary particle size is preferably from 2 to 50 nm, and more preferably from 5 to 15 nm. The primary particle size is a value obtained by examined with a transmission electron microscope.

When the above inorganic fine particles are used, the particles may be used directly as is, or may be used in a colloidal state obtained by dispersing the particles beforehand in water or an organic solvent (colloidal particles).

In addition, fine particles obtained by treatment with silicon dioxide, an organosilicon compound, an organometallic compound or the like may be used as the inorganic fine particles.

Here, "treatment with silicon dioxide" refers to growing microparticulate silicon oxide by a known method on the surface of the particles in an inorganic fine particle-containing dispersion. "Treatment with organosilicon compound" and "treatment with an organometallic compound" refer to adding these compounds to an inorganic fine particle-containing dispersion and stirring under applied heat.

The organosilicon compound is exemplified by silane coupling agents and silanes. Illustrative examples of silane coupling agents include vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethylditriethoxysilane, 3-glycidoxypropyltriethoxysilane, p-styryltrimethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane, 3-acryloyloxypropyltrimethoxysilane, N-2-(aminoethyl)-3-aminopropylmethyldimethoxysilanae, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, 3-chloropropyltrimethoxysilane, 3-mercaptopropylmethyldimethoxysilane, 3-mercaptopropyltrimethoxysilane, bis(triethoxysilylpropyl)tetrasulfide and 3-isocyanatopropyltriethoxysilane.

Illustrative examples of silanes include methyltrichlorosilane, dimethyldichlorosilane, trimethylchlorosilane, phenyltrichlorosilane, methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, decyltrimethoxysilane, trifluoropropyltrimethoxysilane and hexamethyldisilazane.

Exemplary organometallic compounds include titanate coupling agents and aluminate coupling agents. Illustrative examples of titanate coupling agents include Plenact KR TTS, KR 46B, KR 38B, KR 138S, KR 238S, 338X, KR 44, KR 9SA, KR ET5 and KR ET (all from Ajinomoto Fine-Techno Co., Inc.). An illustrative example of an aluminum coupling agent is Plenact AL-M (Ajinomoto Fine-Techno Co., Inc.).

These organosilicon compounds and organometallic compounds are used in an amount of preferably from 2 to 100 parts by weight per 100 parts by weight of the inorganic fine particles.

Metal oxide colloidal particles can be produced by a known method, such as an ion exchange process, a peptization process, a hydrolysis process or a reaction process.

Examples of ion exchange processes include methods in which an acidic salt of the metal is treated with a hydrogen-form ion-exchange resin, and methods in which a basic salt of the metal is treated with a hydroxide-form anion-exchange resin.

Examples of peptization processes include methods in which an acidic salt of the metal is neutralized with a base, methods in which an alkoxide of the metal is hydrolyzed, and methods in which a basic salt of the metal is hydrolyzed under heating after which the unwanted acid is removed.

Examples of reaction processes include methods in which a powder of the metal is reacted with an acid.

The crosslinkable functional groups on the inorganic fine particles are exemplified by methylol, methoxymethyl, epoxy, oxetane, (blocked) isocyanate, acid anhydride and (meth)acryloyloxy groups.

These functional groups may be suitably selected according to the functional groups on the concomitantly used crosslinking agent, although in this invention, as with the crosslinking agent, it is preferable to use (blocked) isocyanate groups, epoxy groups or (meth)acryloyloxy groups.

A hitherto known method may be used as the method of introducing the crosslinkable functional groups. For example, use may be made of the method described in WO 2011/090084, or the method described in JP-A 2010-254889.

It is preferable for the inventive film-forming composition containing a triazine ring-containing hyperbranched polymer, a crosslinking agent and crosslinkable functional group-containing inorganic fine particles to be a uniform dispersion in the form of a varnish obtained by the hybridization of these various ingredients.

Here, "hybridization" refers broadly to mixing together solutes of differing natures and having them intermingle in the state of a solution. The differing solutes may or may not have chemical or physical interactions therebetween, so long as the dispersibility is maintained.

The method of preparation used for hybridization is not particularly limited, provided stability of the final varnish is obtained.

Examples of such methods include (1) mixing the triazine ring-containing hyperbranched polymer in a solid state into a crosslinkable functional group-containing inorganic fine particle dispersion, (2) mixing the triazine ring-containing hyperbranched polymer in a solution state into a crosslinkable functional group-containing inorganic fine particle dispersion, and (3) simultaneously adding the triazine ring-containing hyperbranched polymer in a solid state in a step in which the inorganic fine particles are dispersed to form a dispersion. From the standpoint of handleability, the method of mixing the triazine ring-containing hyperbranched polymer in a solution state into a crosslinkable functional group-containing inorganic fine particle dispersion is preferred.

The stability of the hybridized final varnish should be such as not to give rise to settling out due to a decrease in dispersibility, large changes in the primary particle size or secondary particle size, a worsening of the coatability, discoloration (whitening, yellowing), or worsening of the film quality.

The solvent that may be used when hybridizing the triazine ring-containing hyperbranched polymer and the crosslinkable functional group-containing inorganic fine particles is not particularly limited, provided it does not adversely affect the stability of the final varnish. In cases where a hyperbranched polymer solution and an inorganic fine particle dispersion are used to prepare the composition, the solvents used in both may be the same or may be different, although to avoid a loss of stability, it is preferable for the solvent polarities to be close. Using a solvent which clearly lowers the dispersibility of the inorganic fine particle dispersion is undesirable.

Illustrative examples of solvents that may be used include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, 7-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, to dimethylsulfoxide and N-cyclohexyl-2-pyrrolidinone. These may be used singly or two or more may be used in combination.

When hybridizing the triazine ring-containing hyperbranched polymer and the dispersion of crosslinkable functional group-containing inorganic fine particles, other ingredients such as the subsequently described surfactants, anti-settling agents and emulsifiers may be added for such purposes as to enhance dispersibility or enhance compatibility.

The content of crosslinkable functional group-containing inorganic fine particles in the composition should be in a range that does not adversely affect the dispersibility of the final varnish obtained, and may be controlled in accordance with the target refractive index, transparency and heat resistance of the film to be produced.

For example, letting the amount of the triazine ring-containing hyperbranched polymer (solids basis) be 100 parts by weight, the crosslinkable functional group-containing inorganic fine particles may be added in a range of from 0.1 to 1,000 parts by weight, and preferably from 1 to 500 parts by weight. From the standpoint of maintaining the film quality and obtaining a stable refractive index, a content of from 10 to 300 parts by weight is more preferred.

In addition, to exhibit resistance in a constant temperature and humidity test chamber set to 60° C. and 90% relative humidity, the amount of crosslinkable functional group-containing inorganic fine particles added per 100 parts by weight of the triazine ring-containing hyperbranched polymers (solids basis) is preferably from 30 to 100 parts by weight, and more preferably from 30 to 50 parts by weight.

Various solvents may be added to the first and second film-forming compositions of the invention and used to dissolve the triazine ring-containing polymer.

In such cases, the solvent may be the same as or different from the solvent used during polymerization. The solvent is not particularly limited; any one or plurality of solvents may be selected and used for this purpose, so long as compatibility with the polymer is not lost.

Such solvents are exemplified by the same as those mentioned above as solvents used for surface modification of the light diffusing agent or as solvents used for hybridizing the polymer and the inorganic fine particles.

The solids content in the film-forming composition is not particularly limited, so long as it is in a range that does not affect the storage stability, and may be suitably set in accordance with the target film thickness. Specifically, from the standpoint of solubility and storage stability, the solids content is preferably from 0.1 to 50 wt %, and more preferably from 0.1 to 40 wt %.

Ingredients other than the triazine ring-containing polymer, crosslinking agent, light diffusing agent, crosslinkable functional group-containing inorganic fine particles and solvent may also be included in the first and second film-forming compositions of the invention, insofar as doing so does not detract from the advantageous effects of the invention. Examples of such other ingredients include leveling agents and surfactants.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30 F-553, F-554, RS-75 and RS-72-K (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the triazine ring-containing polymer is preferably from 0.0001 to 5 parts by weight, more preferably from 0.001 to 1 part by weight, and even more preferably from 0.01 to 0.5 part by weight.

The other ingredients mentioned above may be added in any step during preparation of the inventive composition.

The first and second film-forming compositions of the invention may be formed into the desired cured films by applying the composition onto a base material, optionally heating to evaporate off the solvent, and subsequently heating or carrying out light exposure to cure the composition.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having pliability.

The bake temperature for evaporating off the solvent is not particularly limited. This may be carried out at, for example, from 40 to 400° C.

The bake process is not particularly limited. For example, evaporation may be effected using a hot plate or an oven, such evaporation being carried out under a suitable atmosphere, such as in open air, in nitrogen or another inert gas, or in a vacuum.

With regard to the bake temperature and time, conditions which are compatible with the processing steps for the target electronic device should be selected. Bake conditions should be selected in such a way that the physical values of the resulting film conform to the required characteristics of the electronic device.

The conditions in cases where exposure to light is carried out are also not particularly limited. For example, an exposure energy and time which are suitable for the triazine ring-containing polymer and crosslinking agent that are used may be employed.

Because the cured film of the invention that has been thus obtained is able to achieve a high heat resistance, high transparency, high refractive index, high solubility and low volume shrinkage, it can be advantageously used as a component in the fabrication of electronic devices such as liquid-crystal displays, organic EL displays, LEDs, solid-state image sensors, organic thin-film solar cells, dye-sensitized solar cells and organic thin-film transistors. In particular, cured films obtained from the first film-forming composition have an excellent light diffusing ability, and therefore can be advantageously used as a material for light-scattering films in organic EL devices and LEDs. Cured films obtained from the second film-forming composition have a resistance to high temperatures and high humidity, and therefore can be advantageously used as refractive index adjusting layers for use in lens components and electronic components required to have such resistance.

To further increase the planarity of the resulting cured film, a composition obtained by removing the light diffusing agent and the inorganic fine particles from the above-described film-forming composition may be rendered into a planarizing material and, by using this material, a planarizing film may be additionally deposited on the cured film.

Specific examples of the triazine ring-containing polymer, crosslinking agent and the like in this planarizing material, as well as the amounts in which these ingredients are included and the film-forming method, are as described above.

EXAMPLES

Synthesis Examples, Working Examples of the invention and Comparative Examples are given below to more concretely illustrate the invention, although the invention is not limited by these Examples. The instruments used for measurement in the Examples were as follows.

[$^1$H-NMR]
 Instruments: Varian NMR System 400 NB (400 MHz)
 JEOL-ECA700 (700 MHz)
 Solvent used in measurement: DMSO-d6
 Reference material: Tetramethylsilane (TMS) ($\delta$=0.0 ppm)

[GPC]
 Instrument: HLC-8200 GPC (Tosoh Corporation)
 Columns: Shodex KF-804L+KF-805L
 Column temperature: 40° C.
 Solvent: Tetrahydrofuran (THF)
 Detector: UV (254 nm)
 Calibration curve: polystyrene standard

[Ellipsometer]
 Instrument: VASE multiple incident angle spectroscopic ellipsometer
 (JA Woollam Japan)

[Thermogravimetric/Differential Thermal Analyzer (TG-DTA)]
 Instrument: TG-8120 (Rigaku Corporation)
 Temperature ramp-up rate: 10° C./min
 Measurement temperatures: 25° C. to 750° C.

[Turbidity Meter]
Instrument: NDH 5000
(Nippon Denshoku Industries Co., Ltd.)
[Atomic Force Microscope]
Instrument: Dimension Icon (Bruker AXS)
Probe: single-crystal silicon
Spring constant: 3 N/m
Resonance wavelength: 80 kHz
Sweep rate: 1 Hz
[Constant Temperature and Humidity Test Chamber]
Instrument: LHU-113 Constant Climate Cabinet
(ESPEC Corporation)
[Haze]
Instrument: NDH 5000 Haze Meter
(Nippon Denshoku Industries Co., Ltd.)
[Optical Microscope]
Instrument: BX51 Research Microscope
(Olympus Corporation)
[1] Synthesis of Triazine Ring-Containing Hyperbranched Polymer Synthesis Example 1

Synthesis of HB-TmDA

[Chemical Formula 20]

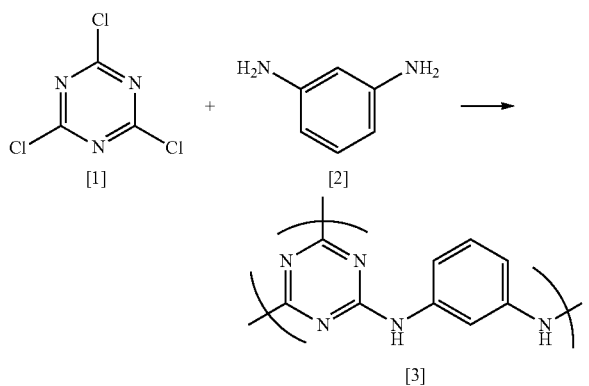

Under nitrogen, 456.02 g of DMAc was added to a 1,000 mL four-neck flask and cooled to −10° C. in an acetone-dry ice bath, following which 84.83 g (0.460 mol) of 2,4,6-trichloro-1,3,5-triazine[1] (Evonik Degussa) was added and dissolved therein. Next, a solution of 62.18 g (0.575 mol) of m-phenylenediamine [2] dissolved in 304.01 g of DMAc and 14.57 g (0.156 mol) of aniline were added dropwise. After dropwise addition, the flask contents were stirred for 30 minutes, then the reaction mixture was added dropwise over a period of 1 hour using a fluid transfer pump to a reactor consisting of a 2,000 mL four-neck flask to which had been added 621.85 g of DMAc and which had been heated beforehand to 85° C. on an oil bath. Following addition of the reaction mixture, stirring was carried out for 1 hour, effecting polymerization.

Next, 113.95 g (1.224 mol) of aniline was added and the flask contents were stirred for 1 hour, bringing the reaction to completion. The system was cooled to room temperature in an ice bath, after which 116.36 g (1.15 mol) of triethylamine was added dropwise and 30 minutes of stirring was carried out, thereby quenching the hydrochloric acid. The hydrochloride that settled out was then removed by filtration. The filtered reaction mixture was reprecipitated in a mixed solution of 28% ammonia water (279.29 g) and 8,820 g of ion-exchanged water. The precipitate was filtered, dried in a vacuum desiccator at 150° C. for 8 hours, then redissolved in 833.1 g of THF and reprecipitated in 6,665 g of ion-exchanged water. The resulting precipitate was filtered, then dried in a vacuum desiccator at 150° C. for 25 hours, yielding 118.0 g of the target polymeric compound [3] (referred to below as "HB-TmDA40").

FIG. 1 shows the measured $^1$H-NMR spectrum for HB-TmDA40. The HB-TmDA40 thus obtained is a compound having structural units of formula (1). The polystyrene-equivalent weight-average molecular weight Mw of HB-TmDA40, as measured by GPC, was 4,300, and the polydispersity Mw/Mn was 3.44.

(1) Heat Resistance Test

Figure 2:
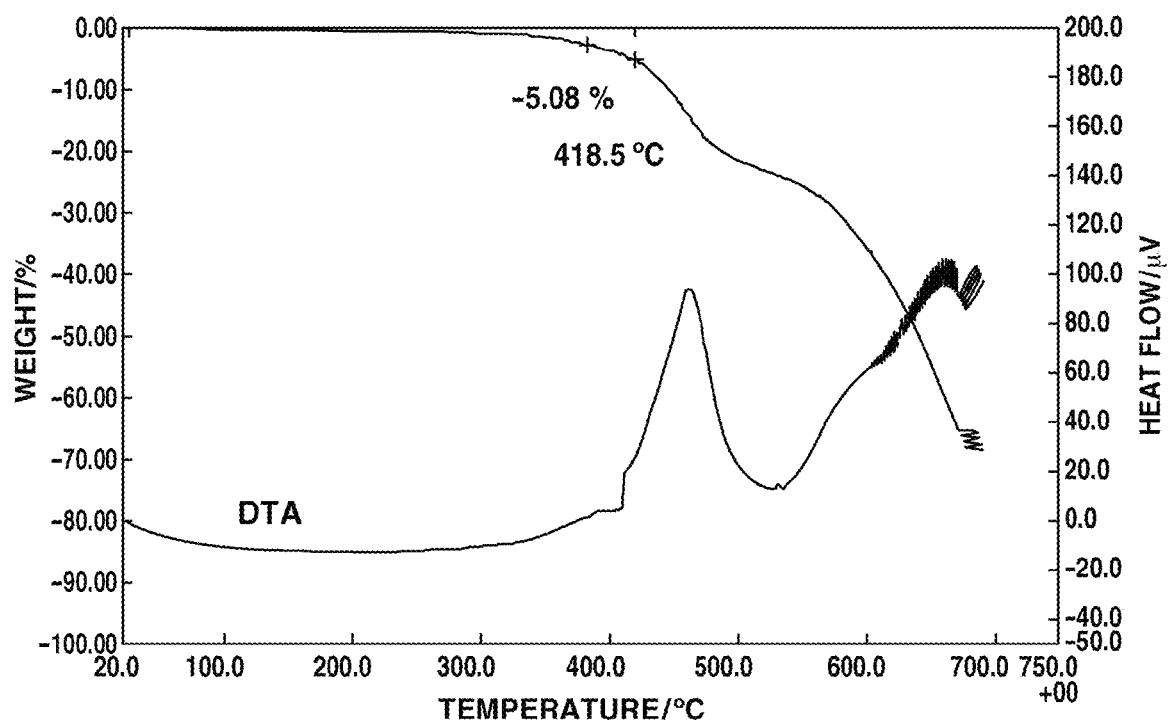
FIG. 2 is a plot showing the TG-DTA results for the polymeric compound [3] obtained in Synthesis Example 1.

TG-DTA measurement was carried out on the HB-TmDA40 obtained in Synthesis Example 1, whereupon the 5% weight loss temperature was 419° C. The results are shown in FIG. 2.

(2) Measurement of Refractive Index

The HB-TmDA40 obtained in Synthesis Example 1 (0.5 g) was dissolved in 4.5 g of cyclohexanone, giving a clear, light yellow-colored solution. Using a spin coater, the resulting polymer varnish was spin-coated onto a glass substrate at 200 rpm for 5 seconds and at 2,000 rpm for 30 seconds, following which the solvent was removed by heating at 150° C. for 1 minute and at 250° C. for 5 minutes, thereby giving a film. Upon measurement, the resulting film was found to have a refractive index at 550 nm of 1.790.

Production Example 1

A 20 wt % solution (referred to below as "HB-TmDA40V") was prepared by dissolving 40 g of the HB-TmDA40 obtained in Synthesis Example 1 in 153.6 g of cyclohexanone and 6.4 g of ion-exchanged water.

Production Example 2

Preparation of Light-Diffusing Particle Dispersion

Cyclohexanone (167.1 g) was added to 52.8 g of melamine resin-silica composite particles (Optbeads® 500S, available from Nissan Chemical Industries, Ltd.; average particle size, 0.5 μm), and dispersed in a wet jet mill (Nano Jet Pul JN20 (trade name), from Jokoh KK) under stirring (the resulting dispersion is referred to below as "500SJ"). Next, 5.0 g of this dispersion was drawn off and the solvent was driven off in an evaporator, leaving 1.2 g of a white powder. Hence, the solids content of the dispersion was 24 wt %.

Production Example 3

Preparation of Surface-Modified Light-Diffusing Particle Dispersion

The 500SJ obtained in Production Example 2 (41.67 g), 3 g (0.0167 mol) of 3-aminopropyltrimethoxysilane (Shin-Etsu Chemical Co., Ltd.), 2.59 g (0.167 mol) of Karenz MOI (Showa Denko K.K.), and 4.7 g of cyclohexanone were added together and stirred under heating at 60° C. After 3 hours, the mixture was cooled to room temperature, giving a surface-modified Optbeads dispersion (referred to below as "500SJ-S").

Production Example 4

Preparation of Light-Diffusing Particle Dispersion

Pure water (26.9 g) was added to 173.1 g of Lightstar LA-S26, an alkaline dispersion of agglomerated silica particles available from Nissan Chemical Industries, Ltd. (solids content, 26.0 wt %; pH 9.9; average particle size obtained by laser diffraction method, 750 nm (measured with a SALD-7000 analyzer, from Shimadzu Corporation); BET specific surface area, 237 m$^2$/g), and the resulting mixture was passed through a column packed with 100 mL of a cation-exchange resin (Amberlite IR-120B, from Organo Corporation), thereby giving 210 g of an acidic dispersion (solids content, 21.2 wt %; pH 2.4).

The resulting acidic dispersion was transferred to a 500 mL round-bottomed flask and, using a rotary evaporator, was dewatered and solvent substituted by warming the flask contents while adding propylene glycol monomethyl ether (referred to below as "PGME") to the flask under a reduced pressure of 100 to 150 Torr and at a bath temperature of 70 to 80° C. When 210 g of PGME, the same amount as the acidic dispersion, had been added, solvent substitution was stopped and 8.7 g of methacryloxypropyltrimethoxysilane (2.0 molecules per square nanometer of silica particle surface) was added under stirring of the dispersion with a magnetic stirrer, following which the dispersion was stirred for 3 hours at a liquid temperature of 70° C.

Next, 0.45 g (1.0 wt % with respect to the silica particles in the dispersion) of tributylamine was added to this dispersion and, using a rotary evaporator, dewatering and solvent substitution were carried out by warming the flask contents while adding 420 g of PGME (corresponding to twice the amount of the acidic dispersion) under a reduced pressure of 100 to 150 Torr and at a bath temperature of 70 to 80° C., thereby preparing a PGME dispersion of agglomerated silica particles (referred to below as "L-PGM1"; solids content, 20.5 wt %; water content, 0.1 wt %; average particle size as measured by laser diffractometry, 760 nm).

Production Example 5

Preparation of Light-Diffusing Particle Dispersion

Pure water (26.9 g) was added to 173.1 g of Lightstar LA-S26, an alkaline dispersion of agglomerated silica particles available from Nissan Chemical Industries, Ltd., and the resulting mixture was passed through, in order, a column packed with 100 mL of a cation-exchange resin (Amberlite IR-120B), a column packed with 100 mL of an anion-exchange resin (Amberlite IRA-410, from Organo Corporation) and a column packed with 50 mL of cation-exchange resin (Amberlite IR-120B), thereby giving 220 g of an acidic dispersion (solids content, 20.0 wt %; pH 2.9).

The resulting acidic dispersion was transferred to a 500 mL round-bottomed flask and, using a rotary evaporator, was dewatered and solvent substituted by warming the flask contents while adding PGME to the flask under a reduced pressure of 100 to 150 Torr and at a bath temperature of 70 to 80° C. When 220 g of PGME, the same amount as the acidic dispersion, had been added, solvent substitution was stopped and 8.6 g of methacryloxypropyltrimethoxysilane (2.0 molecules per square nanometer of silica particle surface) was added under stirring of the dispersion with a magnetic stirrer, following which the dispersion was stirred for 3 hours at a liquid temperature of 70° C.

Next, 0.22 g (0.5 wt % with respect to the silica particles in the dispersion) of tributylamine was added to this dispersion and, using a rotary evaporator, dewatering and solvent substitution were carried out by warming the flask contents while adding 440 g of PGME (corresponding to twice the amount of the acidic dispersion) under a reduced pressure of 100 to 150 Torr and at a bath temperature of 70 to 80° C., thereby preparing a PGME dispersion of agglomerated silica particles (referred to below as "L-PGM2"; solids content, 20.5 wt %; water content, 0.1 wt %; average particle size as measured by laser diffractometry, 760 nm).

Production Example 6

Preparation of Light-Diffusing Particle Dispersion

Aside from changing the amount of methacryloxypropyltrimethoxysilane added to 12.9 g (3.0 molecules per square nanometer of silica particle surface), a PGME dispersion of agglomerated silica particles (solids content, 20.5 wt %; water content, 0.8 wt %; average particle size as measured by laser diffractometry, 790 nm; referred to below as "L-PGM3") was prepared in the same way as in Production Example 5.

Production Example 7

Preparation of Light-Diffusing Particle Dispersion

Cyclohexanone (9.0 g) was added to 1.0 g of crosslinked polymethyl methacrylate spherical particles (Techpolymer SSX-101, from Sekisui Plastics Co., Ltd.; average particle size, 1.5 μm), and the mixture was stirred with a mixing rotor available under the trade name VMR-5R from As One Corporation), then dispersed for 3 hours with a 150 W bath-type sonicator. This dispersion was filtered using a syringe filter (available under the trade name "MS PTFE Syringe Filter" from Membrane Solutions; pore size, 5.0 μm), giving a filtered dispersion (referred to below as "SSX101-D").

Production Example 8

Preparation of Light-Diffusing Particle Dispersion

Cyclohexanone (9.0 g) was added to 1.0 g of crosslinked PMMA particles (Chemisnow MX-150, from Soken Chemical & Engineering Co., Ltd.; average particle size, 1.5 μm), and the mixture was stirred with a mixing rotor, then dispersed for 3 hours with a 150 W bath-type sonicator. The dispersion was filtered with a syringe filter (this dispersion is referred to below as "MX150-D").

Production Example 9

Preparation of Light-Diffusing Particle Dispersion

Cyclohexanone (9.0 g) was added to 1.0 g of titanium oxide particles (the rutile-type titanium oxide JR-600A available from Tayca K.K.; average particle size, 0.25 μm), and the mixture was stirred with a mixing rotor, then dispersed for 3 hours with a 150 W bath-type sonicator. The dispersion was filtered with a syringe filter (this dispersion is referred to below as "JR600A-D").

Production Example 10

Preparation of Light-Diffusing Particle Dispersion

Cyclohexanone (9.0 g) was added to 1.0 g of titanium oxide particles (the rutile-type titanium oxide JR-1000A available from Tayca K.K.; average particle size, 1 μm), and the mixture was stirred with a mixing rotor, then dispersed for 3 hours with a 150 W bath-type sonicator. The dispersion was filtered with a syringe filter (this dispersion is referred to below as "JR1000-D").

Production Example 11

Preparation of Light-Diffusing Particle Dispersion

Cyclohexanone (9.0 g) was added to 1.0 g of titanium oxide particles (the rutile-type titanium oxide MP-70 available from Tayca K.K.; average particle size, 0.7 μm), and the mixture was stirred with a mixing rotor, then dispersed for 3 hours with a 150 W bath-type sonicator. The dispersion was filtered with a syringe filter (this dispersion is referred to below as "MP70-D").

Production Example 12

Preparation of Light-Diffusing Particle Dispersion

Cyclohexanone (27.0 g) was added to 3.0 g of titanium oxide particles (the rutile-type titanium oxide JA-600A), and the mixture was stirred with a mixing rotor, giving a dispersion. The dispersion was filtered with a syringe filter (this dispersion is referred to below as "JA600A-2D").

Production Example 13

Preparation of Light-Diffusing Particle Dispersion

Cyclohexanone (27.0 g) was added to 3.0 g of titanium oxide particles (the rutile-type titanium oxide JA-1000), and the mixture was stirred with a mixing rotor, giving a dispersion. The dispersion was filtered with a syringe filter (this dispersion is referred to below as "JA1000-2D").

Production Example 14

Preparation of Light-Diffusing Particle Dispersion

Cyclohexanone (27.0 g) was added to 3.0 g of titanium oxide particles (the rutile-type titanium oxide MP-70), and the mixture was stirred with a mixing rotor, giving a dispersion. The dispersion was filtered with a syringe filter (this dispersion is referred to below as "MP70-2D").

Production Example 15

Preparation of Light-Diffusing Particle Dispersion

Cyclohexanone (24.0 g) was added to 6.0 g of titanium oxide particles (the rutile-type titanium oxide JA-600A), and the mixture was stirred with a mixing rotor, giving a dispersion. The dispersion was filtered with a syringe filter (this dispersion is referred to below as "JA600A-3D").

Production Example 16

Preparation of Light-Diffusing Particle Dispersion

A 500 mL round-bottomed flask was charged with 220.0 g of Lightstar LA-S233A, an acidic dispersion of agglomerated silica particles available from Nissan Chemical Industries, Ltd. (solids content, 23.0 wt %; pH 2.9; average particle size as measured by laser diffractometry, 300 nm (measured with a SALD-7000 analyzer from Shimadzu Corporation); BET specific surface area, 240 m$^2$/g). Using a rotary evaporator, the dispersion was dewatered and solvent substituted by warming the flask contents while adding PGME to the flask under a reduced pressure of 100 to 150 Torr and at a bath temperature of 70 to 80° C. When 215.8 g of PGME had been added, solvent substitution was stopped and 8.3 g of methacryloxypropyltrimethoxysilane (2.0 molecules per square nanometer of silica particle surface) was added under stirring of the dispersion with a magnetic stirrer, following which the dispersion was stirred for 3 hours at a liquid temperature of 70° C.

Next, 0.3 g (0.6 wt % with respect to the silica particles in the dispersion) of N-ethyldiisopropylamine was added to this dispersion and, using a rotary evaporator, dewatering and solvent substitution were carried out by warming the flask contents while adding 296.2 g of PGME under a reduced pressure of 100 to 150 Torr and at a bath temperature of 70 to 80° C. The resulting dispersion was then filtered with a filter having a pore size of 5 μm (ROKI Ez-Change™ SLOPE-PURE 20L-SL-050XS), thereby preparing a PGME dispersion of agglomerated silica particles (referred to below as "L-PGM4"; solids content, 19.6 wt %; water content, 0.4 wt %; average particle size as measured by laser diffractometry, 300 mm).

Production Example 17

Preparation of Light-Diffusing Particle Dispersion

Titanium oxide particles (20 g, the rutile-type titanium oxide JA-600A), 79.8 g of cyclohexanone, 2.1 g of 3-methacryloxypropyltriethoxysilane (KBE-503, from Shin-Etsu Chemical Co., Ltd.) and 0.2 g of ion-exchanged water were added together and stirred at 60° C. for 3 hours. Next, 12 g of the HB-TmDA40V prepared in Production Example 1 was added to 42 g of this dispersion, and dispersion was carried out with an ultrahigh-speed universal-type homogenizer (here and below, Physcotron NS-565, from Microtec Co., Ltd.). The resulting dispersion was filtered with a syringe filter (this dispersion is referred to below as "JA600A-KBE10-D").

Production Example 18

Preparation of Light-Diffusing Particle Dispersion

Titanium oxide particles (20 g, the rutile-type titanium oxide JA-600A), 80.0 g of cyclohexanone, 0.2 g of 3-methacryloxypropyltriethoxysilane (KBE-503) and 0.03 g of ion-exchanged water were added together and stirred at 60° C. for 3 hours. Next, 12 g of the HB-TmDA40V prepared in Production Example 1 was added to 42 g of this dispersion, and dispersion was carried out with an ultrahigh-speed universal-type homogenizer. The resulting dispersion was filtered with a syringe filter (this dispersion is referred to below as "JA600A-KBE1-D").

Example 1

Light Scattering Film-Forming Composition 1

A dispersion (referred to below as "HB-TmDA40-500SJ-80") was prepared by adding together 5 g of the solution HB-TmDA40V prepared in Production Example 1, 2.67 g of the dispersion 500SJ-S prepared in Production Example 3, 0.2 g of the crosslinking agent B-882N (Mitsui Chemicals, Inc.), 0.05 g of a 1 wt % cyclohexanone solution of the surfactant Megafac R-30-N (DIC Corporation), and 0.78 g of cyclohexanone/ion-exchanged water (96:4, wt/wt).

Example 2

Light Scattering Film-Forming Composition 2

Aside from changing the amount of dispersion 500SJ-S used to 3 g and setting the amount of the cyclohexanone/ion-exchanged water (96:4, wt/wt) mixed solvent added to 0.88 g, a dispersion (referred to below as "HB-TmDA40-500SJ-90") was prepared in the same way as in Example 1.

Example 3

Light Scattering Film-Forming Composition 3

Aside from changing the amount of the dispersion 500SJ-S used to 3.33 g and setting the amount of the cyclohexanone/ion-exchanged water (96:4, wt/wt) mixed solvent added to 0.98 g, a dispersion (referred to below as "HB-TmDA40-500SJ-100") was prepared in the same way as in Example 1.

Example 4

Light Scattering Film-Forming Composition 4

Aside from changing the amount of the dispersion 500SJ-S used to 4 g and setting the amount of the cyclohexanone/ion-exchanged water (96:4, wt/wt) mixed solvent added to 1.19 g, a dispersion (referred to below as "HB-TmDA40-500SJ-120") was prepared in the same way as in Example 1.

Example 5

Light Scattering Film 1

The HB-TmDA40-500SJ-80 dispersion prepared in Example 1 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-500SJ-80-C").

Example 6

Light Scattering Film 2

Aside from using the HB-TmDA40-500SJ-90 dispersion prepared in Example 2, a cured film (referred to below as "HB-TmDA40-500SJ-90-C") was obtained in the same way as in Example 5.

Example 7

Light Scattering Film 3

Aside from using the HB-TmDA40-500SJ-100 dispersion prepared in Example 3, a cured film (referred to below as "HB-TmDA40-500SJ-100-C") was obtained in the same way as in Example 5.

Example 8

Light Scattering Film 4

Aside from using the HB-TmDA40-500SJ-120 dispersion prepared in Example 4, a cured film (referred to below as "HB-TmDA40-500SJ-120-C") was obtained in the same way as in Example 5.

The total light transmittance (T.T.), haze value (HAZE), parallel transmittance (P.T.) and diffuse transmittance (DIF) of each of Light Scattering Films 1 to 4 produced in above Examples 5 to 8 were measured using a turbidity meter. The results are shown in Table 1.

TABLE 1

| | Cured film | HAZE | T.T. (%) | P.T. (%) | DIF (%) |
|---|---|---|---|---|---|
| Example 5 | HB-TmDA40-500SJ-80-C | 47.46 | 97.56 | 51.25 | 46.31 |
| Example 6 | HB-TmDA40-500SJ-90-C | 55.81 | 98.37 | 43.47 | 54.90 |
| Example 7 | HB-TmDA40-500SJ-100-C | 64.99 | 99.42 | 34.80 | 64.61 |
| Example 8 | HB-TmDA40-500SJ-120-C | 75.93 | 100.00 | 24.44 | 77.10 |

As shown in Table 1, it is apparent that including surface-modified light-diffusing particles improves the light diffusing performance and that, as the proportion of surface-modified light-diffusing particles included increases, the HAZE value, the total transmittance and the diffuse transmittance rise.

Example 9

Light Scattering Film-Forming Composition 5

A dispersion (referred to below as "HB-TmDA40-L1-10") was prepared by adding together 5 g of the solution HB-TmDA40V prepared in Production Example 1, 0.5 g of the dispersion L-PGM1 prepared in Production Example 4, 0.2 g of crosslinking agent (B-882N), 0.05 g of a 1 wt % cyclohexanone solution of the surfactant Megafac R-30-N (DIC Corporation), and 0.07 g of cyclohexanone/ion-exchanged water (96:4, wt/wt).

Example 10

Light Scattering Film-Forming Composition 6

Aside from changing the amount of the solution L-PGM1 used to 1.0 g and setting the amount of the cyclohexanone/ion-exchanged water (96:4, wt/wt) mixed solvent added to 0.05 g, a dispersion (referred to below as "HE-TmDA40-L1-20") was prepared in the same way as in Example 9.

Example 11

Light Scattering Film-Forming Composition 7

Aside from changing the amount of the solution L-PGM1 used to 1.5 g and setting the amount of the cyclohexanone/ ion-exchanged water (96:4, wt/wt) mixed solvent added to 0.02 g, a dispersion (referred to below as "HB-TmDA40-L1-30") was prepared in the same way as in Example 9.

Example 12

Light Scattering Film-Forming Composition 8

Aside from using the dispersion L-PGM2 prepared in Production Example 5 instead of L-PGM1 and setting the amount of the cyclohexanone/ion-exchanged water (96:4, wt/wt) mixed solvent added to 0.07 g, a dispersion (referred to below as "HB-TmDA40-L2-10") was prepared in the same way as in Example 9.

Example 13

Light Scattering Film-Forming Composition 9

Aside from changing the amount of the dispersion L-PGM2 used to 1.0 g and setting the amount of the cyclohexanone/ion-exchanged water (96:4, wt/wt) mixed solvent added to 0.05 g, a dispersion (referred to below as "HB-TmDA40-L2-20") was prepared in the same way as in Example 12.

Example 14

Light Scattering Film-Forming Composition 10

Aside from changing the amount of the dispersion L-PGM2 used to 1.5 g and setting the amount of the cyclohexanone/ion-exchanged water (96:4, wt/wt) mixed solvent added to 0.05 g, a dispersion (referred to below as "HB-TmDA40-L2-30") was prepared in the same way as in Example 12.

Example 15

Light Scattering Film-Forming Composition 11

Aside from using the dispersion L-PGM3 prepared in Production Example 6 instead of L-PGM1 and setting the amount of the cyclohexanone/ion-exchanged water (96:4, wt/wt) mixed solvent added to 0.07 g, a dispersion (referred to below as "HB-TmDA40-L3-10") was prepared in the same way as in Example 9.

Example 16

Light Scattering Film-Forming Composition 12

Aside from changing the amount of the dispersion L-PGM3 used to 1.0 g and setting the amount of the cyclohexanone/ion-exchanged water (96:4, wt/wt) mixed solvent added to 0.05 g, a dispersion (referred to below as "HB-TmDA40-L3-20") was prepared in the same way as in Example 15.

Example 17

Light Scattering Film-Forming Composition 13

Aside from changing the amount of the dispersion L-PGM3 used to 1.5 g and setting the amount of the cyclohexanone/ion-exchanged water (96:4, wt/wt) mixed solvent added to 0.05 g, a dispersion (referred to below as "HB-TmDA40-L3-30") was prepared in the same way as in Example 15.

Example 18

Light Scattering Film 5

The HB-TmDA40-L1-10 dispersion prepared in Example 9 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-L1-10-C").

Example 19

Light Scattering Film 6

Aside from using the HB-TmDA40-L1-20 dispersion prepared in Example 10, a cured film (referred to below as "HB-TmDA40-L1-20-C") was obtained in the same way as in Example 18.

Example 20

Light Scattering Film 7

Aside from using the HB-TmDA40-L1-30 dispersion prepared in Example 11, a cured film (referred to below as "HB-TmDA40-L1-30-C") was obtained in the same way as in Example 18.

Example 21

Light Scattering Film 8

Aside from using the HB-TmDA40-L2-10 dispersion prepared in Example 12, a cured film (referred to below as "HB-TmDA40-L2-10-C") was obtained in the same way as in Example 18.

Example 22

Light Scattering Film 9

Aside from using the HB-TmDA40-L2-20 dispersion prepared in Example 13, a cured film (referred to below as "HB-TmDA40-L2-20-C") was obtained in the same way as in Example 18.

Example 23

Light Scattering Film 10

Aside from using the HB-TmDA40-L2-30 dispersion prepared in Example 14, a cured film (referred to below as "HB-TmDA40-L2-30-C") was obtained in the same way as in Example 18.

Example 24

Light Scattering Film 11

Aside from using the HB-TmDA40-L3-10 dispersion prepared in Example 15, a cured film (referred to below as "HB-TmDA40-L3-10-C") was obtained in the same way as in Example 18.

Example 25

Light Scattering Film 12

Aside from using the HB-TmDA40-L3-20 dispersion prepared in Example 16, a cured film (referred to below as "HB-TmDA40-L3-20-C") was obtained in the same way as in Example 18.

Example 26

Light Scattering Film 13

Aside from using the HB-TmDA40-L3-30 dispersion prepared in Example 17, a cured film (referred to below as "HB-TmDA40-L3-30-C") was obtained in the same way as in Example 18.

The total light transmittance (T.T.), haze value (HAZE), parallel transmittance (P.T.) and diffuse transmittance (DIF) of each of the Light Scattering Films 5 to 13 produced in above Examples 18 to 26 were measured using a turbidity meter. The results are shown in Table 2.

TABLE 2

| | Cured film | HAZE | T.T. (%) | P.T. (%) | DIF (%) |
|---|---|---|---|---|---|
| Example 18 | HB-TmDA40-L1-10-C | 27.5 | 96.1 | 69.7 | 26.4 |
| Example 19 | HB-TmDA40-L1-20-C | 61.0 | 98.4 | 38.4 | 60.0 |
| Example 20 | HB-TmDA40-L1-30-C | 67.7 | 97.8 | 31.6 | 66.2 |
| Example 21 | HB-TmDA40-L2-10-C | 24.5 | 95.8 | 72.3 | 23.5 |
| Example 22 | HB-TmDA40-L2-20-C | 57.2 | 97.8 | 41.8 | 56.0 |
| Example 23 | HB-TmDA40-L2-30-C | 66.2 | 98.4 | 33.3 | 65.1 |
| Example 24 | HB-TmDA40-L3-10-C | 25.9 | 96.1 | 71.2 | 24.9 |
| Example 25 | HB-TmDA40-L3-20-C | 55.9 | 97.1 | 42.8 | 54.3 |
| Example 26 | HB-TmDA40-L3-30-C | 67.8 | 98.1 | 31.6 | 66.6 |

As shown in Table 2, it is apparent that including surface-modified inorganic light-diffusing particles improves the light diffusing performance and that, as the proportion of surface-modified inorganic light-diffusing particles included increases, the HAZE value and the diffuse transmittance rise.

Example 27

Light Scattering Film-Forming Composition 14

A dispersion (referred to below as "HB-TmDA40-SSX101-30") was prepared by adding together 2.5 g of the solution HB-TmDA40V prepared in Production Example 1, 1.5 g of the dispersion SSX101-D prepared in Production Example 7, 0.16 g of crosslinking agent (B-882N), and 0.02 g of cyclohexanone/ion-exchanged water (96:4, wt/wt).

Example 28

Light Scattering Film-Forming Composition 15

A dispersion (referred to below as "HB-TmDA40-MX150-30") was prepared by adding together 2.5 g of the solution HB-TmDA40V prepared in Production Example 1, 1.5 g of the dispersion MX150-D prepared in Production Example 8, 0.14 g of crosslinking agent (B-882N), and 0.02 g of cyclohexanone/ion-exchanged water (96:4, wt/wt).

Example 29

Light Scattering Film-Forming Composition 16

A dispersion (referred to below as "HB-TmDA40-JA600A-3-30") was prepared by adding together 2.5 g of the solution HB-TmDA40V prepared in Production Example 1, 1.5 g of the dispersion JR600A-D prepared in Production Example 9, 0.14 g of crosslinking agent (B-882N), and 0.02 g of cyclohexanone/ion-exchanged water (96:4, wt/wt).

Example 30

Light Scattering Film-Forming Composition 17

A dispersion (referred to below as "HB-TmDA40-JR1000-30") was prepared by adding together 2.5 g of the solution HB-TmDA40V prepared in Production Example 1, 1.5 g of the dispersion JR1000-D prepared in Production Example 10, 0.14 g of crosslinking agent (B-882N), and 0.03 g of cyclohexanone/ion-exchanged water (96:4, wt/wt).

Example 31

Light Scattering Film-Forming Composition 18

A dispersion (referred to below as "HB-TmDA40-MP70-30") was prepared by adding together 2.5 g of the solution HB-TmDA40V prepared in Production Example 1, 1.5 g of the dispersion MP70-D prepared in Production Example 11, 0.14 g of crosslinking agent (B-882N), and 0.02 g of cyclohexanone/ion-exchanged water (96:4, wt/wt).

Example 32

Light Scattering Film 14

The HB-TmDA40-SSX101-30 dispersion prepared in Example 27 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-SSX101-30-C").

Example 33

Light Scattering Film 15

Aside from using the HB-TmDA40-MX150-30 dispersion prepared in Example 28, a cured film (referred to below as "HB-TmDA40-MX150-30-C") was obtained in the same way as in Example 32.

Example 34

Light Scattering Film 16

Aside from using the HB-TmDA40-JR600A-30 dispersion prepared in Example 29, a cured film (referred to below as "HB-TmDA40-JR600A-30-C") was obtained in the same way as in Example 32.

Example 35

Light Scattering Film 17

Aside from using the HB-TmDA40-JR1000-30 dispersion prepared in Example 30, a cured film (referred to below as "HB-TmDA40-JR1000-30-C") was obtained in the same way as in Example 32.

Example 36

Light Scattering Film 18

Aside from using the HB-TmDA40-MP70-30 dispersion prepared in Example 31, a cured film (referred to below as "HB-TmDA40-MP70-30-C") was obtained in the same way as in Example 32.

The total light transmittance (T.T.), haze value (HAZE), parallel transmittance (P.T.) and diffuse transmittance (DIF) of each of the Light Scattering Films 14 to 18 produced in above Examples 32 to 36 were measured using a turbidity meter. The results are shown in Table 3.

TABLE 3

| | Cured film | HAZE | T.T. (%) | P.T. (%) | DIF (%) |
|---|---|---|---|---|---|
| Example 32 | HB-TmDA40-SSX101-30-C | 58.74 | 94.99 | 39.19 | 55.80 |
| Example 33 | HB-TmDA40-MX150-30-C | 43.77 | 94.63 | 53.21 | 41.42 |
| Example 34 | HB-TmDA40-JR600A-30-C | 66.40 | 81.70 | 27.45 | 54.25 |
| Example 35 | HB-TmDA40-JR1000-30-C | 45.08 | 85.80 | 47.12 | 38.68 |
| Example 36 | HB-TmDA40-MP70-30-C | 34.63 | 88.12 | 57.60 | 30.52 |

Example 37

Light Scattering Film-Forming Composition 19

A dispersion (referred to below as "HB-TmDA40-JA600A-2-30") was prepared by adding together 5 g of the solution HB-TmDA40V prepared in Production Example 1, 3.0 g of the dispersion JA600A-2D prepared in Production Example 12, 0.29 g of crosslinking agent (B-882N), and 0.06 g of cyclohexanone/ion-exchanged water (96:4, wt/wt).

Example 38

Light Scattering Film-Forming Composition 20

A dispersion (referred to below as "HB-TmDA40-JA1000-2-30") was prepared by adding together 5 g of the solution HB-TmDA40V prepared in Production Example 1, 3.0 g of the dispersion JA1000-2D prepared in Production Example 12, 0.30 g of crosslinking agent (B-882N), and 0.05 g of cyclohexanone/ion-exchanged water (96:4, wt/wt).

Example 39

Light Scattering Film-Forming Composition 21

A dispersion (referred to below as "HB-TmDA40-MP70-2-30") was prepared by adding together 5 g of the solution HB-TmDA40V prepared in Production Example 1, 3.0 g of the dispersion MP70-2D prepared in Production Example 14, 0.30 g of crosslinking agent (B-882N), and 0.06 g of cyclohexanone/ion-exchanged water (96:4, wt/wt).

Example 40

Light Scattering Film 19

The HB-TmDA40-JA600A-2-30 dispersion prepared in Example 37 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-JA600A-2-30-C").

Example 41

Light Scattering Film 20

The HB-TmDA40-JA1000-2-30 dispersion prepared in Example 38 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-JA1000-2-30-C").

Example 42

Light Scattering Film 21

The HB-TmDA40-MP70-2-30 dispersion prepared in Example 39 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-MP70-2-30-C").

The total light transmittance (T.T.), haze value (HAZE), parallel transmittance (P.T.) and diffuse transmittance (DIF) of each of the Light Scattering Films 19 to 21 produced in above Examples 40 to 42 were measured using a turbidity meter. The results are shown in Table 4.

TABLE 4

| | Cured film | HAZE | T.T. (%) | P.T. (%) | DIF (%) |
|---|---|---|---|---|---|
| Example 40 | HB-TmDA40-JA600A-2-30-C | 68.95 | 80.55 | 25.01 | 55.54 |
| Example 41 | HB-TmDA40-JA1000-2-30-C | 41.18 | 86.72 | 51.01 | 35.71 |
| Example 42 | HB-TmDA40-MP70-2-30-C | 46.76 | 85.53 | 45.54 | 39.99 |

Example 43

Light Scattering Film-Forming Composition 22

A dispersion (referred to below as "HB-TmDA40-JA600A-3-20") was prepared by adding together 2.5 g of the solution HB-TmDA40V prepared in Production Example 1, 0.5 g of the dispersion JA600A-3D prepared in Production Example 15, 0.15 g of crosslinking agent (B-882N), and 0.4 g of cyclohexanone/ion-exchanged water (96:4, wt/wt).

Example 44

Light Scattering Film-Forming Composition 23

Aside from changing the amount of the dispersion JA600A-3D used to 0.75 g and setting the amount of the cyclohexanone/ion-exchanged water (96:4, wt/wt) mixed solvent added to 0.05 g, a dispersion (referred to below as "HB-TmDA40-JA600A-3-30") was prepared in the same way as in Example 43.

Example 45

Light Scattering Film-Forming Composition 24

Aside from changing the amount of the dispersion JA600A-3D used to 1.0 g, a dispersion (referred to below as "HB-TmDA40-JA600A-3-40") was prepared in the same way as in Example 43.

Example 46

Light Scattering Film-Forming Composition 25

Aside from changing the amount of the dispersion JA600A-3D used to 1.27 g, a dispersion (referred to below as "HB-TmDA40-JA600A-3-50") was prepared in the same way as in Example 43.

Example 47

Light Scattering Film-Forming Composition 26

Aside from changing the amount of the dispersion JA600A-3D used to 1.5 g, a dispersion (referred to below as "HB-TmDA40-JA600A-3-60") was prepared in the same way as in Example 43.

Example 48

Light Scattering Film-Forming Composition 27

Aside from changing the amount of the dispersion JA600A-3D used to 1.75 g, a dispersion (referred to below as "HB-TmDA40-JA600A-3-70") was prepared in the same way as in Example 43.

Example 49

Light Scattering Film 22

The HB-TmDA40-JA600A-3-20 dispersion prepared in Example 43 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-JA600A-3-20-C").

Example 50

Light Scattering Film 23

Aside from using the HB-TmDA40-JA600A-30 dispersion prepared in Example 44, a cured film (referred to below as "HB-TmDA40-JA600A-3-30-C") was obtained in the same way as in Example 49.

Example 51

Light Scattering Film 24

Aside from using the HB-TmDA40-JA600A-3-40 dispersion prepared in Example 45, a cured film (referred to below as "HB-TmDA40-JA600A-3-40-C") was obtained in the same way as in Example 49.

Example 52

Light Scattering Film 25

Aside from using the HB-TmDA40-JA600A-3-50 dispersion prepared in Example 46, a cured film (referred to below as "HB-TmDA40-JA600A-3-50-C") was obtained in the same way as in Example 49.

Example 53

Light Scattering Film 26

Aside from using the HB-TmDA40-JA600A-3-60 dispersion prepared in Example 47, a cured film (referred to below as "HB-TmDA40-JA600A-3-60-C") was obtained in the same way as in Example 49.

Example 54

Light Scattering Film 27

Aside from using the HB-TmDA40-JA600A-3-70 dispersion prepared in Example 48, a cured film (referred to below as "HB-TmDA40-JA600A-3-70-C") was obtained in the same way as in Example 49.

The total light transmittance (T.T.), haze value (HAZE), parallel transmittance (P.T.) and diffuse transmittance (DIF) of each of the Light Scattering Films 22 to 27 produced in above Examples 49 to 54 were measured using a turbidity meter. The results are shown in Table 5.

TABLE 5

|  | Cured film | HAZE | T.T. (%) | P.T. (%) | DIF (%) |
| --- | --- | --- | --- | --- | --- |
| Example 49 | HB-TmDA40-JA600A-3-20-C | 60.39 | 82.43 | 32.65 | 49.78 |
| Example 50 | HB-TmDA40-JA600A-3-30-C | 72.78 | 79.28 | 21.58 | 57.70 |
| Example 51 | HB-TmDA40-JA600A-3-40-C | 81.31 | 75.78 | 14.16 | 61.62 |
| Example 52 | HB-TmDA40-JA600A-3-50-C | 88.34 | 73.39 | 8.56 | 64.83 |
| Example 53 | HB-TmDA40-JA600A-3-60-C | 90.24 | 73.24 | 7.15 | 66.09 |
| Example 54 | HB-TmDA40-JA600A-3-70-C | 92.44 | 71.97 | 5.44 | 66.53 |

Example 55

Light Scattering Film-Forming Composition 28

A dispersion (referred to below as "HB-TmDA40-L4-30") was prepared by adding together 2.5 g of the solution HB-TmDA40V prepared in Production Example 1, 0.75 g of the dispersion L-PGM4 prepared in Production Example 16, 0.16 g of crosslinking agent (B-882N), and 0.36 g of cyclohexanone/ion-exchanged water (96:4, wt/wt).

Example 56

Light Scattering Film-Forming Composition 29

Aside from changing the amount of the solution L-PGM4 used to 1.26 g and setting the amount of the crosslinking agent (B-882N) used to 0.14 g, a dispersion (referred to below as "HB-TmDA40-L4-50") was prepared in the same way as in Example 55.

Example 57

Light Scattering Film-Forming Composition 30

Aside from changing the amount of the solution L-PGM4 used to 1.76 g and setting the amount of the crosslinking agent (B-882N) used to 0.16 g, a dispersion (referred to below as "HB-TmDA40-L4-70") was prepared in the same way as in Example 55.

Example 58

Light Scattering Film-Forming Composition 31

Aside from changing the amount of the L-PGM4 used to 2.25 g and setting the amount of the crosslinking agent (B-882N) used to 0.14 g, a dispersion (referred to below as "HB-TmDA40-L4-90") was prepared in the same way as in Example 55.

Example 59

Light Scattering Film-Forming Composition 32

A dispersion (referred to below as "HB-TmDA40-JA600A-10-L4-30") was prepared by adding together 2.5 g of the solution HB-TmDA40V prepared in Production Example 1, 0.3 g of the dispersion JA600A-D prepared in Production Example 9, 0.75 g of the dispersion L-PGM4 prepared in Production Example 16, 0.14 g of crosslinking agent (B-882N), and 0.12 g of cyclohexanone/ion-exchanged water (96:4, wt/wt).

Example 60

Light Scattering Film-Forming Composition 33

Aside from changing the amount of the solution L-PGM4 used to 1.24 g and setting the amount of the crosslinking agent (B-882N) used to 0.15 g, a dispersion (referred to below as "HB-TmDA40-JA600A-10-L4-50") was prepared in the same way as in Example 59.

Example 61

Light Scattering Film-Forming Composition 34

Aside from changing the amount of the solution L-PGM4 used to 1.75 g and setting the amount of the crosslinking agent (B-882N) used to 0.16 g, a dispersion (referred to below as "HB-TmDA40-JA600A-10-L4-70") was prepared in the same way as in Example 59.

Example 62

Light Scattering Film-Forming Composition 35

Aside from changing the amount of the solution L-PGM4 used to 2.25 g and setting the amount of the crosslinking agent (B-882N) used to 0.14 g, a dispersion (referred to below as "HB-TmDA40-JA600A-10-L4-90") was prepared in the same way as in Example 59.

Example 63

Light Scattering Film 28

The HB-TmDA40-L4-30 dispersion prepared in Example 55 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-L4-30-C").

Example 64

Light Scattering Film 29

Aside from using the HB-TmDA40-L4-50 dispersion prepared in Example 56, a cured film (referred to below as "HB-TmDA40-L4-50-C") was obtained in the same way as in Example 63.

Example 65

Light Scattering Film 30

Aside from using the HB-TmDA40-L4-70 dispersion prepared in Example 57, a cured film (referred to below as "HB-TmDA40-L4-70-C") was obtained in the same way as in Example 63.

Example 66

Light Scattering Film 31

Aside from using the HB-TmDA40-L4-90 dispersion prepared in Example 58, a cured film (referred to below as "HB-TmDA40-L4-90-C") was obtained in the same way as in Example 63.

Example 67

Light Scattering Film 32

The HB-TmDA40-JA600A-10-L4-30 dispersion prepared in Example 59 was formed into a film by spin-coating at 200 rpm for 5 seconds and at 1,000 rpm for 30 seconds. The spin-coated film was then dried at 100° C. for 1 minute and at 250° C. for 5 minutes, giving a cured film (referred to below as "HB-TmDA40-JA600A-10-L4-30-C").

Example 68

Light Scattering Film 33

Aside from using the HB-TmDA40-JA600A-10-L4-50 dispersion prepared in Example 60, a cured film (referred to below as "HB-TmDA40-JA600A-10-L4-50-C") was obtained in the same way as in Example 67.

Example 69

Light Scattering Film 34

Aside from using the HB-TmDA40-JA600A-10-L4-70 dispersion prepared in Example 61, a cured film (referred to below as "HB-TmDA40-JA600A-10-L4-70-C") was obtained in the same way as in Example 67.

Example 70

Light Scattering Film 35

Aside from using the HB-TmDA40-JA600A-10-L4-90 dispersion prepared in Example 62, a cured film (referred to below as "HB-TmDA40-JA600A-10-L4-90-C") was obtained in the same way as in Example 67.

The total light transmittance (T.T.), haze value (HAZE), parallel transmittance (P.T.) and diffuse transmittance (DIF) of each of the Light Scattering Films 28 to 35 produced in above Examples 63 to 70 were measured using a turbidity meter. The results are shown in Table 6.

TABLE 6

|  | Cured film | HAZE | T.T. (%) | P.T. (%) | DIF (%) |
| --- | --- | --- | --- | --- | --- |
| Example 63 | HB-TmDA40-L4-30-C | 25.88 | 93.14 | 69.04 | 24.10 |
| Example 64 | HB-TmDA40-L4-50-C | 44.46 | 94.78 | 52.64 | 42.14 |
| Example 65 | HB-TmDA40-L4-70-C | 48.22 | 90.40 | 46.81 | 43.59 |
| Example 66 | HB-TmDA40-L4-90-C | 40.19 | 86.07 | 51.48 | 34.59 |
| Example 67 | HB-TmDA40-JA600A-10-L4-30-C | 59.64 | 86.67 | 34.98 | 51.69 |
| Example 68 | HB-TmDA40-JA600A-10-L4-50-C | 71.09 | 89.24 | 25.80 | 63.44 |
| Example 69 | HB-TmDA40-JA600A-10-L4-70-C | 52.91 | 82.89 | 39.03 | 43.86 |
| Example 70 | HB-TmDA40-JA600A-10-L4-90-C | 52.49 | 79.29 | 37.67 | 41.62 |

Example 71

Light Scattering Film-Forming Composition 36

A dispersion (referred to below as "HB-TmDA40-JA600A-KBE10-70") was prepared by adding together 4.0 g of the solution HB-TmDA40V prepared in Production Example 1, 4.5 g of the dispersion JA600A-KBE10-D prepared in Production Example 17, 0.29 g of crosslinking agent (B-882N), and 0.7 g of cyclohexanone/ion-exchanged water (96:4, wt/wt).

Example 72

Light Scattering Film-Forming Composition 37

Aside from using 4.5 g of the dispersion JA600A-KBE1-D prepared in Production Example 18 instead of the dispersion JA600A-KBE10-D, a dispersion (referred to below as "HB-TmDA40-JA600A-KBE1-70") was prepared in the same way as in Example 71.

Example 73

Light Scattering Film 36

The HB-TmDA40-JA600A-KBE10-70 dispersion prepared in Example 71 was formed into a film by spin-coating at 200 rpm for 5 seconds and at 500 rpm for 30 seconds. The spin-coated film was then dried at 100° C. for 1 minute and at 250° C. for 5 minutes, giving a cured film (referred to below as "HB-TmDA40-JA600A-KBE10-70-05").

Example 74

Light Scattering Film 37

Aside from forming the film under spin-coating conditions of 200 rpm for 5 seconds and 1,000 rpm for 30 seconds, a cured film (referred to below as "HB-TmDA40-JA600A-KBE10-70-C") was obtained in the same way as in Example 73.

Example 75

Light Scattering Film 38

The HB-TmDA40-JA600A-KBE1-70 dispersion prepared in Example 72 was formed into a film by spin-coating at 200 rpm for 5 seconds and at 500 rpm for 30 seconds. The spin-coated film was then dried at 100° C. for 1 minute and at 250° C. for 5 minutes, giving a cured film (referred to below as "HB-TmDA40-JA600A-KBE1-70-05").

Example 76

Light Scattering Film 39

Aside from forming the film under spin-coating conditions of 200 rpm for 5 seconds and 1,000 rpm for 30 seconds, a cured film (referred to below as "HB-TmDA40-JA600A-KBE1-70-C") was obtained in the same way as in Example 75.

The total light transmittance (T.T.), haze value (HAZE), parallel transmittance (P.T.) and diffuse transmittance (DIF) of each of the Light Scattering Films 36 to 39 produced in above Examples 73 to 76 were measured using a turbidity meter. The results are shown in Table 7.

TABLE 7

|  | Cured film | HAZE | T.T. (%) | P.T. (%) | DIF (%) |
|---|---|---|---|---|---|
| Example 73 | HB-TmDA40-JA600A-KBE10-70-05 | 88.74 | 64.75 | 7.29 | 57.46 |
| Example 74 | HB-TmDA40-JA600A-KBE10-70-C | 89.20 | 69.32 | 7.49 | 61.83 |
| Example 75 | HB-TmDA40-JA600A-KBE1-70-05 | 91.75 | 63.12 | 5.21 | 57.91 |
| Example 76 | HB-TmDA40-JA600A-KBE1-70-C | 88.83 | 70.57 | 7.88 | 62.69 |

Production Example 19

The polymer HB-TmDA40 obtained in Synthesis Example 1 (100 g) was dissolved in a mixed solvent of 384.0 g of cyclohexanone and 16.0 g of ion-exchanged water, thereby preparing a 20 wt % solution (referred to below as "HB-TmDA40V1").

Production Example 20

Production of Crosslinkable Functional Group-Containing Zirconia Sol (Propylene Glycol Monomethyl Ether Sol of Modified Zirconium Oxide-Stannic Oxide Composite Colloidal Particles)

Production was carried out as follows, in general accordance with the method described in WO 2011/090084.
(a) Production of $SiO_2/SnO_2$
JIS No. 3 Sodium silicate, 36 g (29.8 wt % $SiO_2$ basis; Fuji Kagaku Corporation), was dissolved in 400 g of pure water, following which 9.8 g of sodium stannate $NaSnO_3 \cdot H_2O$ (55.1 wt % $SnO_2$ basis; Showa Denko KK) was dissolved. The resulting aqueous solution was passed through a column packed with a hydrogen-form cation-exchange resin (Amberlite® IR-120B), thereby giving 1,240 g of an acidic aqueous sol of stannic oxide-silica composite colloidal particles (pH 2.4, 0.44 wt % $SnO_2$ basis, 0.87 wt % $SiO_2$ basis; $SiO_2/SnO_4$ weight ratio, 2.0). Next, 3.2 g of diisopropylamine was added to this aqueous sol. The resulting sol was an alkaline aqueous sol of stannic oxide-silica composite colloidal particles having a pH of 8.0. In this aqueous sol, colloidal particles having a primary particle size of 5 nm or less were observed with a transmission electron microscope. The molar ratio diisopropylamine/$(SnO_2+SiO_2)$ was 0.15.
(b) Preparation of Zirconia Sol
A 1 m³ vessel was charged with 251.85 kg of an aqueous solution of tetramethylammonium bicarbonate (from Tama Chemicals Co., Ltd.; 42.4 wt % tetramethylammonium hydroxide basis) and 95.6 kg of pure water, thereby forming a dilute aqueous solution. Zirconium oxycarbonate powder ($ZrOCO_3$, from AMR; 40.11 wt % $ZrO_2$ basis) was then gradually added to the aqueous solution in a total amount of 491.85 kg while stirring the solution. After the completion of addition, the vessel contents were warmed to 85° C., following which 8.23 kg of metastannic acid (from Showa Denko KK; containing the equivalent of 7.08 kg of $SnO_2$) was gradually added, and 5 hours of heat aging at 105° C. was carried out. When heat aging was completed, the mixture was in the form of a sol. In addition, 5 hours of hydrothermal treatment at 145° C. was carried out. The product obtained after hydrothermal treatment was a sol containing colloidal particles of a zirconium oxide-stannic oxide composite. This had a $(ZrO_2+SnO_2)$ concentration of 12.86 wt %, a specific gravity of 1.180, and a pH of 10.62.

Next, this sol was washed and concentrated with an ultrafiltration system while adding pure water, yielding 1,040 kg of a zirconium oxide-stannic oxide composite colloidal particle-containing sol having a concentration of 6.03 wt %, a specific gravity of 1.052, and a pH of 9.43. The resulting zirconium oxide-stannic oxide composite colloid had a particle size, as determined by electronic microscopy, of 5 to 15 nm.
(c) Production of Covered Particles
The alkaline aqueous sol of stannic oxide-silica composite colloidal particles prepared by the method in (a) was added in an amount of 769 g to 830 g of the aqueous sol of zirconium oxide-stannic oxide composite colloidal particles prepared in (b), and thoroughly stirred. Next, the mixture was heat-aged at 95° C. for 2 hours, giving 1,599 g of an aqueous sol of modified zirconium oxide-stannic oxide composite colloidal particles covered with stannic oxide-silica composite colloidal particles. The resulting sol had a pH of 8.3 and a total metal oxide content of 3.7 wt %. The aqueous sol of modified zirconium oxide-stannic oxide composite colloidal particles was passed through a column packed with a hydrogen-form cation-exchange resin (Amberlite IR-120B), giving 1,980 g of an acidic aqueous sol of modified zirconium oxide-stannic oxide composite colloidal particles. The resulting sol had a pH of 2.7 and a total metal oxide content of 3.0 wt %. Next, 0.5 g of diisobutylamine was added to the resulting acidic sol, thereby causing diisobutylamine to bond to the surface of the modified zirconium oxide-stannic oxide composite colloidal particles. The sol at this time had a pH of 4.3. The resulting sol was then concentrated to a total metal oxide content of 20 wt % with an ultrafiltration system. The concentrated sol had a specific gravity of 1.211 and a pH of 3.7. This concentrated aqueous sol was charged into an evaporator fitted with a round-bottomed flask and, while adding methanol to the sol, water was distilled off at 600 Torr, thereby giving a methanol sol of the modified zirconium oxide-stannic oxide composite colloidal particles to which diisobutylamine was bonded. The resulting methanol sol had a specific gravity of 0.961, a viscosity of 1.0 mPa·s, a pH of 4.9 (when diluted with the same weight of water as the sol), a total metal oxide content of 21 wt %, and a moisture content of 2.3%.
(d) Preparation of PGME Dispersion
After adding 5.5 g of 3-methacryloxypropyltrimethoxysilane (available from Shin-Etsu Silicone under the trade name KBM503) and 15 g of n-propanol to 214 g of the methanol sol obtained in (c), silylation was carried out by 5 hours of refluxing and superheating, thereby bonding the 3-methacryloxypropyltrimethoxysilane to the surface of the modified zirconium oxide-stannic oxide composite colloidal particles. Next, by distilling off the methanol with an evaporator at 160 Torr while adding propylene glycol monomethyl ether, the methanol was replaced with propylene glycol monomethyl ether, thereby giving a propylene glycol monomethyl ether sol of modified zirconium oxide-stannic oxide composite colloidal particles to the surface of which were bonded diisobutylamine and 3-methacryloxypropyltrimethoxysilane. The resulting sol had a specific gravity of 1.234, a viscosity of 4.4 mPa·s, and a total metal oxide content of 30.5 wt %.

Example 77

Preparation 1 of Film-Forming Composition

A varnish having a total solids content of 3 wt % (referred to below as "HB-TmDA40VF1") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.2 g of the propylene glycol monomethyl ether sol of modified zirconium oxide-stannic oxide composite colloidal particles obtained in Production Example 2, 0.32 g of ion-exchanged water and 7.34 g of cyclohexanone, and visually confirming that dissolution had occurred.

Example 78

Preparation 2 of Film-Forming Composition

A varnish having a total solids content of 3 wt % (referred to below as "HB-TmDA40VF2") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.2 g of the propylene glycol monomethyl ether sol of modified zirconium oxide-stannic oxide composite colloidal particles obtained in Production Example 2, 0.37 g of ion-exchanged water and 8.51 g of cyclohexanone, and visually confirming that dissolution had occurred.

Example 79

Preparation 3 of Film-Forming Composition

A varnish having a total solids content of 3 wt % (referred to below as "HB-TmDA40VF3") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.33 g of the propylene glycol monomethyl ether sol of modified zirconium oxide-stannic oxide composite colloidal particles obtained in Production Example 2, 0.42 g of ion-exchanged water and 9.63 g of cyclohexanone, and visually confirming that dissolution had occurred.

Example 80

Preparation 4 of Film-Forming Composition

A varnish having a total solids content of 3 wt % (referred to below as "HB-TmDA40VF4") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.50 g of the propylene glycol monomethyl ether sol of modified zirconium oxide-stannic oxide composite colloidal particles obtained in Production Example 2, 0.47 g of ion-exchanged water and 11.02 g of cyclohexanone, and visually confirming that dissolution had occurred.

Example 81

Preparation 5 of Film-Forming Composition

A varnish having a total solids content of 3 wt % (referred to below as "HB-TmDA40VF5") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.67 g of the propylene glycol monomethyl ether sol of modified zirconium oxide-stannic oxide composite colloidal particles obtained in Production Example 2, 0.53 g of ion-exchanged water and 12.41 g of cyclohexanone, and visually confirming that dissolution had occurred.

Example 82

Preparation 6 of Film-Forming Composition

A varnish having a total solids content of 3 wt % (referred to below as "HB-TmDA40VF6") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 1.00 g of the propylene glycol monomethyl ether sol of modified zirconium oxide-stannic oxide composite colloidal particles obtained in Production Example 2, 0.65 g of ion-exchanged water and 15.19 g of cyclohexanone, and visually confirming that dissolution had occurred.

Example 83

Preparation 7 of Film-Forming Composition

A varnish having a total solids content of 3 wt % (referred to below as "HB-TmDA40VF7") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.2 g of a silica sol having methacryl groups on the surface (MIBK-SD, from Nissan Chemical Industries, Ltd.), 0.37 g of ion-exchanged water and 8.51 g of cyclohexanone, and visually confirming that dissolution had occurred.

Comparative Example 1

Preparation 8 of Film-Forming Composition

A varnish having a total solids content of 3 wt % (referred to below as "HB-TmDA40VF8") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.20 g of a propylene glycol monomethyl ether sol of modified zirconium oxide-stannic oxide composite colloidal particles without crosslinking sites that was prepared in accordance with the method described in WO 2011/090084, 0.37 g of ion-exchanged water and 8.47 g of cyclohexanone, and visually confirming that dissolution had occurred.

Comparative Example 2

Preparation 9 of Film-Forming Composition

A varnish having a total solids content of 3 wt % (referred to below as "HB-TmDA40VF9") was prepared by adding together 1.0 g of the HB-TmDA40V1 dispersion prepared in Production Example 19, 0.033 g of a 60 wt % cyclohexanone solution of ethoxidized glycerol triacrylate (A-GLY-20E, 200 mPa·s; from Shin-Nakamura Chemical Co., Ltd.), 0.033 g of a 60 wt % cyclohexanone solution of ethoxidized pentaerythritol tetraacrylate (ATM-35E, 350 mPa·s; from Shin-Nakamura Chemical Co., Ltd.), 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.37 g of ion-exchanged water and 8.47 g of cyclohexanone, and visually confirming that dissolution had occurred.

Comparative Example 3

Preparation 10 of Film-Forming Composition

A varnish having a total solids content of 3 wt % (referred to below as "HB-TmDA40VF10") was prepared by adding together 1.0 g of the HB-TmDA40V1 dispersion prepared in Production Example 19, 0.32 g of a 5 wt % cyclohexanone solution of the photoradical initiator Irgacure 184 (BASF), 0.01 g of a 1 wt % cyclohexanone solution of the surfactant Megafac R-30-N (DIC Corporation), 0.20 g of the propylene glycol monomethyl ether sol of the modified zirconium oxide-stannic oxide composite colloidal particles obtained in Production Example 2, 0.32 g of ion-exchanged water and 7.30 g of cyclohexanone, and visually confirming that dissolution had occurred.

Example 84

Refractive Index Measurement 1

Using a spin coater, the HB-TmDA40VF1 varnish prepared in Example 19 was spin-coated onto a soda-lime-silica glass substrate at 200 rpm for 5 seconds and at 1,500 rpm for 30 seconds, following which a 3-minute bake at 130° C. was carried out in an oven. Next, the applied varnish was cured with a high-pressure mercury vapor lamp under a cumulative exposure dose of 600 mJ/cm$^2$, thereby giving a cured film. Upon measurement, the resulting film was found to have a refractive index of 1.759 at 550 nm.

Example 85

Refractive Index Measurement 2

Aside from using the HB-TmDA40VF2 varnish prepared in Example 78, a cured film was obtained in the same way as in Example 84. Upon measurement, the resulting film was found to have a refractive index of 1.756 at 550 nm.

Example 86

Refractive Index Measurement 3

Aside from using the HB-TmDA40VF3 varnish prepared in Example 79, a cured film was obtained in the same way as in Example 84. Upon measurement, the resulting film was found to have a refractive index of 1.750 at 550 nm.

Example 87

Refractive Index Measurement 4

Aside from using the HB-TmDA40VF4 varnish prepared in Example 80, a cured film was obtained in the same way as in Example 84. Upon measurement, the resulting film was found to have a refractive index of 1.759 at 550 nm.

Example 88

Refractive Index Measurement 5

Aside from using the HB-TmDA40VF5 varnish prepared in Example 81, a cured film was obtained in the same way as in Example 84. Upon measurement, the resulting film was found to have a refractive index of 1.748 at 550 nm.

Example 89

Refractive Index Measurement 6

Aside from using the HB-TmDA40VF6 varnish prepared in Example 82, a cured film was obtained in the same way as in Example 84. Upon measurement, the resulting film was found to have a refractive index of 1.739 at 550 nm.

Example 90

Refractive Index Measurement 7

Aside from using the HB-TmDA40VF7 varnish prepared in Example 83, a cured film was obtained in the same way as in Example 84. Upon measurement, the resulting film was found to have a refractive index of 1.692 at 550 nm.

Example 91

Refractive Index Measurement 8

Using a spin coater, the HB-TmDA40VF2 varnish prepared in Example 78 was spin-coated onto an alkali-free glass substrate at 200 rpm for 5 seconds and at 1,500 rpm for 30 seconds, following which a 3-minute bake at 130° C. was carried out in an oven. Next, the applied varnish was cured with a high-pressure mercury vapor lamp under a cumulative exposure dose of 600 mJ/cm$^2$, thereby giving a cured film. Upon measurement, the resulting film was found to have a refractive index of 1.755 at 550 nm.

Comparative Example 4

Refractive Index Measurement 9

Aside from using the HB-TmDA40VF8 varnish prepared in Comparative Example 1, a cured film was obtained in the same way as in Example 84. Upon measurement, the resulting film was found to have a refractive index of 1.763 at 550 nm.

Comparative Example 5

Refractive Index Measurement 10

Aside from using the HB-TmDA40VF9 varnish prepared in Comparative Example 2, a cured film was obtained in the same way as in Example 84. Upon measurement, the resulting film was found to have a refractive index of 1.731 at 550 nm.

Comparative Example 6

Refractive Index Measurement 11

Aside from using the HB-TmDA40VF10 varnish prepared in Comparative Example 3, a cured film was obtained in the same way as in Example 84. Upon measurement, the resulting film was found to have a refractive index of 1.818 at 550 nm.

The haze value and transmittance of each of the films produced in above Examples 84 to 91 and Comparative Examples 4 to 6 were measured. The results are shown in Table 8.

Samples of each of the films produced in Examples 84 to 91 and Comparative Examples 4 to 6 were placed in a constant temperature and humidity test chamber set to 60° C. and 90% relative humidity, and held under these conditions for 500 hours, following which the changes in transmittance and haze were measured. The presence or absence of cracks in the films following the test were determined by examination under an optical microscope. These results are also presented in Table 8.

TABLE 8

|  | Amount of inorganic fine particles added (pbw) | Before test | | | | After test | | |
| --- | --- | --- | --- | --- | --- | --- | --- | --- |
|  |  | Refractive index (at 550 nm) | Film thickness (nm) | Transmittance (%) | HAZE (%) | Transmittance (%) | HAZE*5 (%) | Cracks |
| Example 84 | 10 | 1.759 | 61.8 | >90 | 0.22 | >90*1 | 0.33*1 | no |
| Example 85 | 30 | 1.756 | 63.0 | >90 | 0.12 | >90 | 0.48 | no |
| Example 86 | 50 | 1.750 | 54.9 | >90 | 0.17 | >90 | 0.50 | no |
| Example 87 | 75 | 1.759 | 55.1 | >90 | 0.22 | >90 | 0.63 | no |
| Example 88 | 100 | 1.748 | 56.4 | >90 | 0.24 | >90 | 0.52 | no |
| Example 89 | 150 | 1.739 | 54.7 | >90 | 0.16 | >90 | 0.68 | no |
| Example 90 | 30 | 1.692 | 67.9 | >90 | 0.17 | >90*2 | 0.40*2 | no |
| Example 91 | 30 | 1.755 | 42.0 | >90 | 0.09 | >90 | 0.20 | no |
| Comparative Example 4 | 30 | 1.763 | 61.3 | >90 | 0.45 | >90*3 | 0.41*3 | yes |
| Comparative Example 5 | 0 | 1.731 | 68.1 | >90 | 0.11 | >90*4 | 0.79*4 | yes |
| Comparative Example 6 | 30 | 1.818 | 62.8 | >90 | 0.20 | >85 | 1.36 | yes |

*1The results shown for Example 84 are after 262 hours.
*2The results shown for Example 90 are after 240 hours.
*3The results shown for Comparative Example 4 are after 168 hours.
*4The results shown for Comparative Example 5 are after 66 hours.
*5Rises in HAZE after 500 hours were due to the soda-lime-silica glass used as the substrate.

Surface roughness measurements were carried out by atomic force microscopic examination on the films produced in Examples 84 to 86. The results are shown in FIGS. 3 to 5 and Table 9.

TABLE 9

|  | Amount of inorganic fine particles added (parts by weight) | Film thickness (nm) | Ra (nm) |
| --- | --- | --- | --- |
| Example 84 | 10 | 61.8 | 0.88 |
| Example 85 | 30 | 63.0 | 1.40 |
| Example 86 | 50 | 54.9 | 1.40 |

Figure 3:
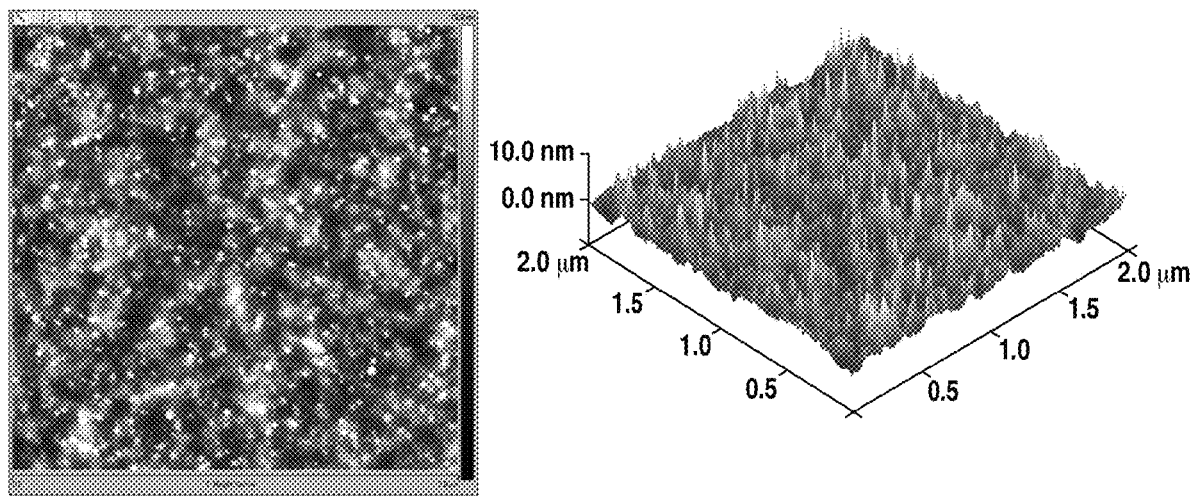
FIG. 3 is an atomic force microscopic (AFM) image of the cured film obtained in Example 84.
Figure 4:
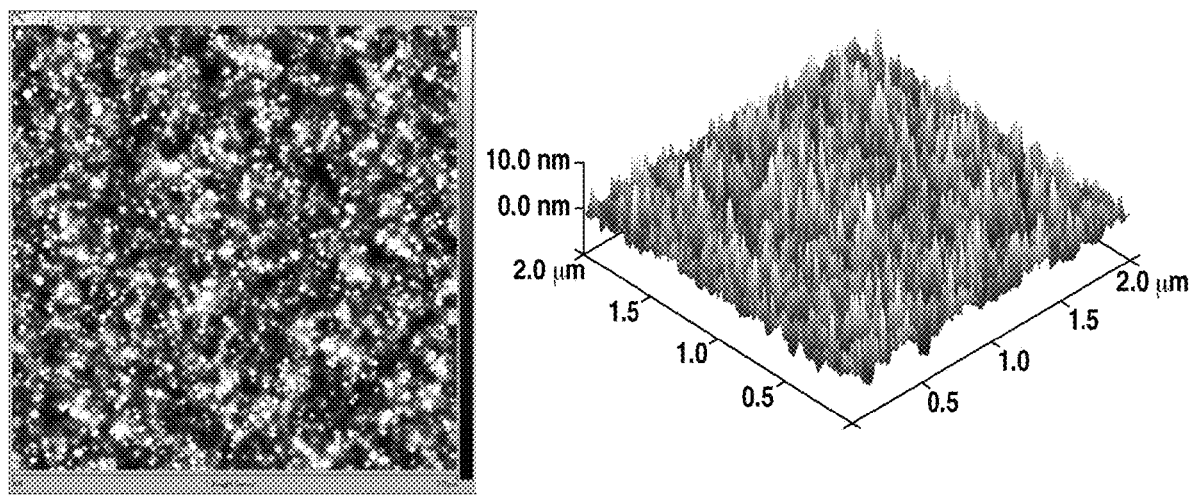
FIG. 4 is an AFM image of the cured film obtained in Example 85.
Figure 5:
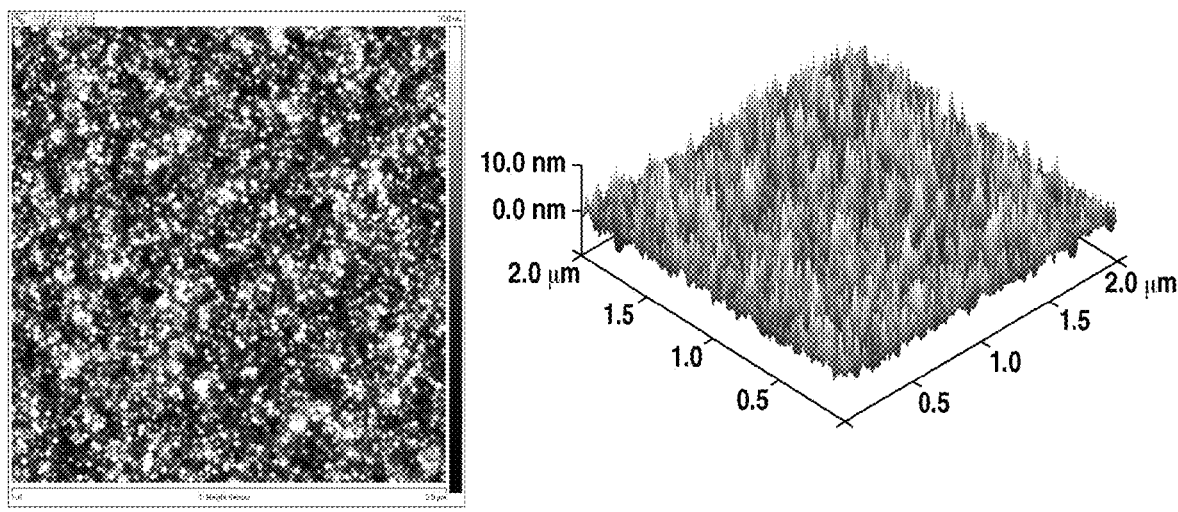
FIG. 5 is an AFM image of the cured film obtained in Example 86.

As shown in FIGS. 3 to 5 and Table 9, it is apparent that the thin-films produced in Examples 84 to 86 had good planarities.

The invention claimed is:

1. A film-forming composition characterized by comprising a triazine ring-containing polymer which includes a recurring unit structure of formula (1) below

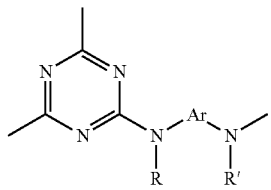
(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

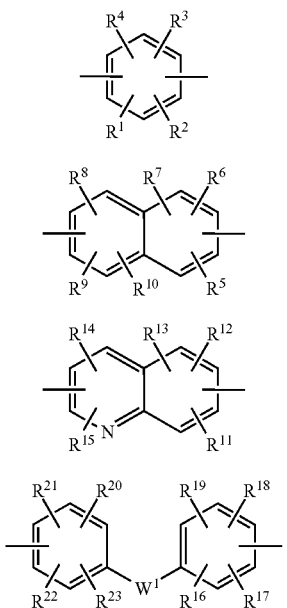

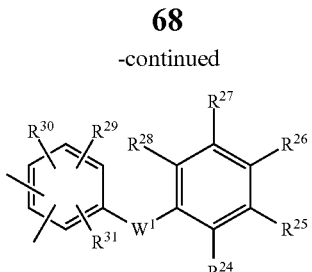
(6)

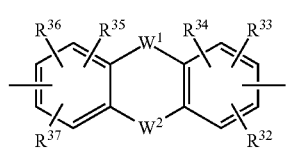
(7)

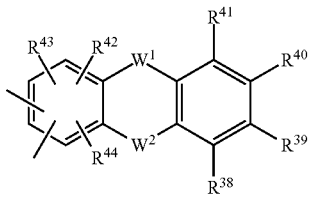
(8)

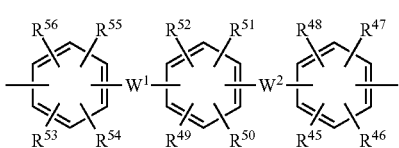
(9)

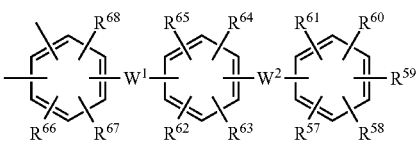
(10)

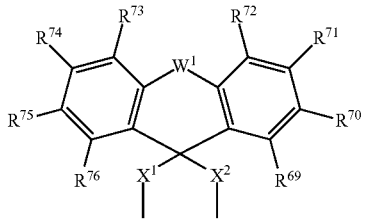
(11)

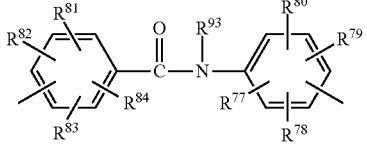
(12)

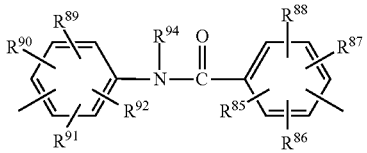
(13)

(in which $R^1$ to $R^{92}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure; $R^{93}$ and $R^{94}$ are hydrogen atoms or alkyl groups of 1 to 10 carbons which may have a branched structure; $W^1$ and $W^2$ are each independently a single bond, $CR^{95}R^{96}$ ($R^{95}$ and $R^{96}$ being each independently a hydrogen atom or an alkyl group of 1 to 10 carbons which may have a branched structure, with the proviso that $R^{95}$ and $R^{96}$ may together form a ring), C=O, O, S, SO, $SO_2$ or $NR^{97}$ ($R^{97}$ being a hydrogen atom or an alkyl group of 1 to 10 carbons which may have a branched structure); and $X^1$ and $X^2$ are each independently a single bond, an alkylene group of 1 to 10 carbons which may have a branched structure, or a group of formula (14) below

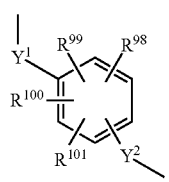

(14)

($R^{98}$ to $R^{101}$ being each independently a hydrogen atom, a halogen atom, a carboxyl group, a sulfo group, an alkyl group of 1 to 10 carbons which may have a branched structure, or an alkoxy group of 1 to 10 carbons which may have a branched structure; and $Y^1$ and $Y^2$ being each independently a single bond or an alkylene group of 1 to 10 carbons which may have a branched structure))),
a crosslinking agent, and
a light diffusing agent having an average particle size of from 200 nm to 3 μm.

2. The film-forming composition of claim 1, wherein the light diffusing agent is titanium oxide, agglomerated silica particles or melamine resin-silica composite particles.

3. The film-forming composition of claim 2, wherein the light diffusing agent is titanium oxide, agglomerated silica particles or melamine resin-silica composite particles treated with a surface modifying agent.

4. The film-forming composition of claim 3, wherein the surface modifying agent is a silane coupling agent having a (meth)acryloyloxy group.

5. The film-forming composition of claim 3, wherein the surface modifying agent is a combination of a silane coupling agent and a compound having a (meth)acryloyloxy group and an isocyanate group.

6. The film-forming composition of claim 5, wherein the silane coupling agent is a silane coupling agent having an amino group.

7. The film-forming composition of claim 5 or 6, wherein the compound having a (meth)acryloyloxy group and an isocyanate group is 2-isocyanatoethyl methacrylate.

8. The film-forming composition of claim 1, wherein the light diffusing agent is an organic-inorganic composite light diffusing agent and/or an organic light diffusing agent.

9. The film-forming composition of claim 1, wherein the crosslinking agent is a compound containing a blocked isocyanate group.

10. A light diffusing film obtained by curing the film-forming composition of claim 1.

11. An organic electroluminescence device comprising the light diffusing film of claim 10.

12. A light-emitting diode comprising the light diffusing film of claim 10.

13. A film-forming composition characterized by comprising
a triazine ring-containing hyperbranched polymer which includes recurring unit structures of formula (1) below

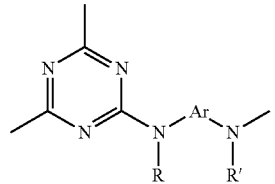

(1)

(wherein R and R' are each independently a hydrogen atom, an alkyl group, an alkoxy group, an aryl group or an aralkyl group; and Ar is at least one moiety selected from the group consisting of moieties of formulas (2) to (13) below

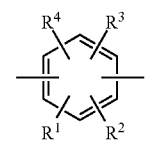

(2)

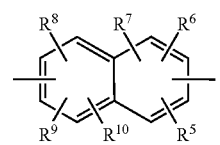

(3)

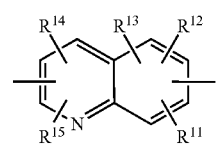

(4)

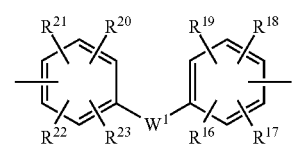

(5)

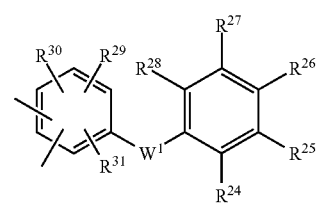

(6)

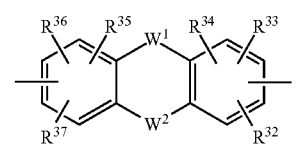

(7)

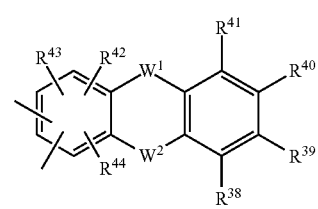

(8)

-continued

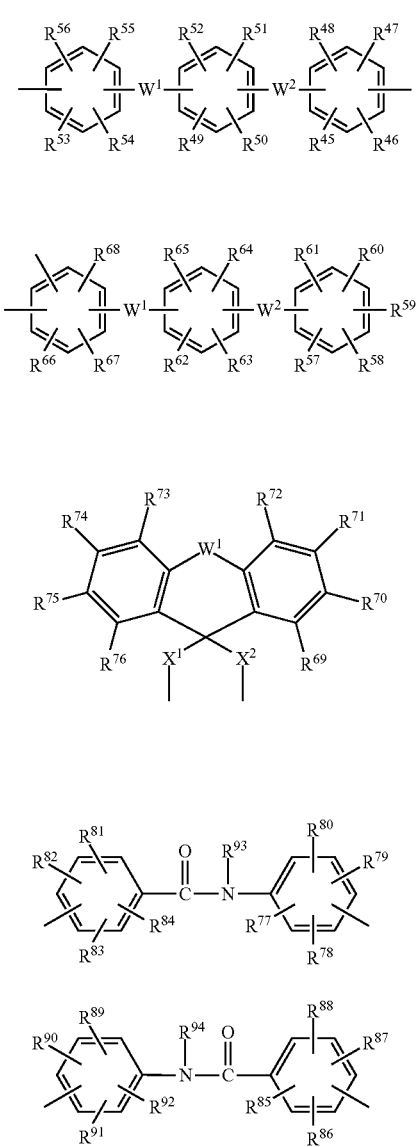

(in which $R^1$ to $R^{92}$ are each independently a hydrogen atom, a halogen atom, a carboxyl group, a sulfo group, an alkyl group of 1 to 10 carbons which may have a branched structure, or an alkoxy group of 1 to 10 carbons which may have a branched structure; $R^{93}$ and $R^{94}$ are hydrogen atoms or alkyl groups of 1 to 10 carbons which may have a branched structure; $W^1$ and $W^2$ are each independently a single bond, $CR^{95}R^{96}$ ($R^{95}$ and $R^{96}$ being each independently a hydrogen atom or an alkyl group of 1 to 10 carbons which may have a branched structure, with the proviso that $R^{95}$ and $R^{96}$ may together form a ring), C=O, O, S, SO, $SO_2$ or $NR^{97}$ ($R^{97}$ being a hydrogen atom or an alkyl group of 1 to 10 carbons which may have a branched structure); and $X^1$ and $X^2$ are each independently a single bond, an alkylene group of 1 to 10 carbons which may have a branched structure, or a group of formula (14) below ($R^{98}$ to $R^{101}$ being each independently a hydrogen atom, a halogen atom, a carboxyl group, a sulfo group, an alkyl group of 1 to 10 carbons which may have a branched structure, or an alkoxy group of 1 to 10 carbons which may have a branched structure; and $Y^1$ and $Y^2$ being each independently a single bond or an alkylene group of 1 to 10 carbons which may have a branched structure))), a crosslinking agent, and crosslinkable functional group-containing inorganic fine particles.

14. The film-forming composition of claim 13, wherein the inorganic fine particles are an oxide, sulfide or nitride of one or more metal selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium.

15. The film-forming composition of claim 13, wherein the inorganic fine particles have a primary particle size of from 2 to 50 nm and are colloidal particles of an oxide of one or more metal selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium.

16. The film-forming composition of claim 15, wherein the inorganic fine particles are colloidal particles of a $ZrO_2$-containing composite metal oxide or colloidal particles of $SiO_2$.

17. The film-forming composition of claim 13, wherein the crosslinking agent is a compound having a (meth)acryl group.

18. The film-forming composition of claim 17, wherein the crosslinking agent is a polyfunctional (meth)acrylic compound.

19. A cured film obtained by curing the film-forming composition of claim 13.

20. A functional film comprising a base material and the cured film of claim 19 formed on the base material.

21. An electronic device comprising a base material and the cured film of claim 19 formed on the base material.

22. The electronic device of claim 21, wherein the cured film is a refractive index adjusting layer.

23. The electronic device of claim 21 or 22 which is an organic electroluminescence display.

24. The film-forming composition of claim 13, wherein the crosslinkable functional groups on the inorganic fine particles are selected from the group consisting of methylol, methoxymethyl, epoxy, oxetane, (blocked) isocyanate, acid anhydride, and (meth)acryloyloxy groups.

25. The film-forming composition of claim 16, wherein the inorganic fine particles are selected from the group consisting of composite colloidal particles of $TiO_2$ with $ZrO_2$, composite colloidal particles of $TiO_2$ with $ZrO_2$ and $SnO_2$, and composite colloidal particles of $ZrO_2$ with $SnO_2$.

* * * * *